US006699634B2

(12) United States Patent
Yamamoto

(10) Patent No.: US 6,699,634 B2
(45) Date of Patent: Mar. 2, 2004

(54) MULTICOLOR IMAGE FORMING MATERIAL

(75) Inventor: Mitsuru Yamamoto, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/455,626

(22) Filed: Jun. 6, 2003

(65) Prior Publication Data

US 2003/0232271 A1 Dec. 18, 2003

(30) Foreign Application Priority Data

Jun. 6, 2002 (JP) .................................... P. 2002-166115
Jun. 2, 2003 (JP) .................................... P. 2003-156653

(51) Int. Cl.[7] .................................................. G03F 7/34
(52) U.S. Cl. ........................ 430/200; 430/964; 430/637
(58) Field of Search ................................ 430/200, 637, 430/964

(56) References Cited

U.S. PATENT DOCUMENTS 5,219,610 A 6/1993 Koshizuka et al.
5,242,887 A 9/1993 Usui
6,326,121 B1 * 12/2001 Takahashi ................... 430/200
6,461,787 B2 * 10/2002 Warner et al. .............. 430/200
2001/0003637 A1 * 6/2001 Goto .......................... 430/200
2002/0009664 A1 * 1/2002 Wachi et al. ............... 430/200
2002/0187418 A1 * 12/2002 Nakamura et al. .......... 430/200

FOREIGN PATENT DOCUMENTS

| | | |
|---|---|---|
| EP | 0 958 935 A2 | 11/1999 |
| JP | 5-58045 | 3/1993 |
| JP | 6-219052 | 8/1994 |
| JP | 2000-135862 | 5/2000 |
| JP | 2002-274074 | 9/2002 |

* cited by examiner

*Primary Examiner*—Richard L. Schilling
(74) *Attorney, Agent, or Firm*—Sughrue Mion, PLLC

(57) ABSTRACT

A multicolor image forming material comprising: an image-receiving sheet comprising an image-receiving layer; and at least four thermal transfer sheets differing in color each comprising a support, a light-to-heat conversion layer and an image-forming layer, wherein the image forming material is used for recording a multicolor image by superposing the image-forming layer of each thermal transfer sheet and the image-receiving layer to face each other, irradiating laser light and transferring a region irradiated with the laser light of the image-forming layer onto the image-receiving layer, and at least one layer selected from the image-receiving layer and the image-forming layers comprises, as a fluorine-containing surfactant, a copolymer (I) comprising following repeating units (A), (B) and (C) as defined herein.

8 Claims, 2 Drawing Sheets

MULTICOLOR IMAGE FORMING MATERIAL

FIELD OF THE INVENTION

The present invention relates to an image forming material comprising a thermal transfer sheet and an image-receiving sheet, which can be used for a multicolor image formation method using laser light.

BACKGROUND OF THE INVENTION

In the field of graphic art, an image is printed on a printing plate using a set of color-separation films prepared from a color original by using lithographic films. In general, a color proof is manufactured from the color-separation films before the main printing (i.e., actual printing operation) so as to check for errors in the color separation process or whether color correction or the like is necessary. The color proof is required to realize high resolution for enabling the formation of a halftone image with high reproducibility and to have capabilities such as high process stability. Furthermore, in order to obtain a color proof approximated to an actual printed matter, the materials used for the actual printed matter are preferably used for the materials of the color proof, for example, the substrate is preferably printing paper and the coloring material is preferably a pigment. With respect to the method for manufacturing the color proof, a dry process of using no developer solution is highly demanded.

Accompanying recent widespread use of computerized systems in the pre-printing process (in the pre-press field), a recording system of producing a color proof directly from digital signals has been developed as the dry preparation method of a color proof. These computerized systems are configured particularly for the purpose of producing a color proof having high image quality and by these systems, a halftone image of 150 lines/inch or more is generally reproduced. In order to record a proof having high image quality from digital signals, laser light capable of modulating by the digital signals and sharply focusing the recording light is used as the recording head. Accordingly, the recording material used with the laser is required to exhibit high recording sensitivity to the laser light and high resolution for enabling the reproduction of high definition halftone dots.

With respect to the recording material for use in the transfer image formation method utilizing laser light, a heat-fusion transfer sheet is known, where a light-to-heat conversion layer capable of absorbing laser light and generating heat and an image-forming layer containing a pigment dispersed in a heat-fusible component such as wax or binder are provided in this order on a support (see, JP-A-5-58045 (the term “JP-A” as used herein means an “unexamined published Japanese patent application”)). According to the image formation method using this recording material, heat is generated in the region irradiated with laser light of the light-to-heat conversion layer and the image-forming layer corresponding to the region is fused by the heat and transferred to an image-receiving sheet stacked and disposed on the transfer sheet, whereby a transfer image is formed on the image-receiving sheet.

JP-A-6-219052 discloses a thermal transfer sheet where a light-to-heat conversion layer containing a light-to-heat converting substance, a very thin (0.03 to 0.3 $\mu$m) thermal release layer and an image-forming layer containing a coloring material are provided in this order on a support. In this thermal transfer sheet, upon irradiation with laser light, the bonding strength between the image-forming layer and the light-to-heat conversion layer bonded through the thermal release layer is weakened and a high definition image is formed on an image-receiving sheet stacked and disposed on the thermal transfer sheet. The image formation method using this thermal transfer sheet utilizes so-called “ablation”, more specifically, a phenomenon that a part of the thermal release layer in the region irradiated with laser light is decomposed and vaporized and thereby the bonding strength between the image-forming layer and the light-to-heat conversion layer is weakened in that region, as a result, the image-forming layer in that region is transferred to an image-receiving sheet stacked on the thermal transfer sheet.

These image formation methods are advantageous in that a printing paper having provided thereon an image-receiving layer (adhesive layer) can be used as the image-receiving sheet material and a multicolor image can be easily obtained by sequentially transferring images of different colors on the image-receiving sheet and also in that a high definition image can be easily obtained. Therefore, these methods are useful for the production of a color proof (DDCP (direct digital color proof)) or a high definition mask image.

SUMMARY OF THE INVENTION

In such a multicolor image formation method, the light-to-heat conversion layer or image-forming layer of the thermal transfer sheet is formed by a coating method. The image-receiving layer of the image-receiving sheet is also formed by a coating method.

In order to obtain stable transferability (sensitivity), the image-forming layer or image-receiving layer must be uniformly coated. If such a layer is not uniformly coated, an uneven surface results or unevenness is generated in the surface energy or adhesive strength and this adversely affects the uniform transferability to the image-receiving sheet.

An object of the present invention is to provide a multicolor image forming material comprising a thermal transfer sheet and an image-receiving sheet, where at least either one of the image-forming layer and the image-receiving layer has a uniform coated surface state and the transferability of an image formed on the image-forming layer to the image-receiving sheet is improved.

According to the present invention, an image forming material having the following constitutions is provided and thereby the above-described object of the present invention can be attained.

1. A multicolor image forming material comprising an image-receiving sheet having an image-receiving layer and at least four thermal transfer sheets differing in color each having at least a light-to-heat conversion layer and an image-forming layer on a support, which is used for recording a multicolor image by superposing the image-forming layer of each thermal transfer sheet and the image-receiving layer of the image-receiving sheet to face each other, irradiating laser light and transferring the region irradiated with the laser light of the image-forming layer onto the image-receiving layer of the image-receiving sheet, wherein at least either one of the image-receiving layer and the image-forming layer contains, as a fluorine-containing surfactant, a copolymer (I) comprising the following repeating units (A), (B) and (C):

(A):

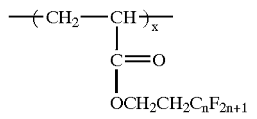

(B):

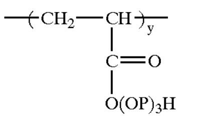

(C):

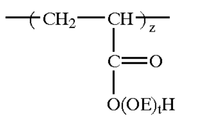

wherein n represents an integer of 1 to 10, x, y and z represent the molar fractions (%) of the repeating units (A), (B) and (C), respectively, and x is from 10 to 80%, y is from 5 to 85% and z is from 5 to 85%, provided that x+y+z=100 mol %, s represents an integer of 2 to 18, t represents an integer of 2 to 18, PO represents $—CH_2CHCH_3O—$, and EO represents $—CH_2CH_2O—$.

2. The multicolor image forming material as described in 1 above, wherein the resolution of the image transferred onto the image-receiving layer is 2,000 dpi or more.

3. The multicolor image forming material as described in 1 or 2 above, wherein the ratio (OD/film thickness) of the optical density (OD) to the film thickness of the light-to-heat conversion layer of each thermal transfer sheet is 0.57 or more.

4. The multicolor image forming material as described in any one of 1 to 3 above, wherein the ratio (OD/film thickness) of the optical density (OD) to the film thickness of the image-forming layer of each thermal transfer sheet is 1.80 or more.

BRIEF DESCRIPTION OF THE DRAWING

FIG. 1 is a view for roughly explaining the mechanism of the multicolor image formation by the transfer of a thin film using a laser.

FIG. 2 is a view showing a constitution example of the recording device for laser thermal transfer.

DESCRIPTION OF NUMERICAL REFERENCES

Figure 1:
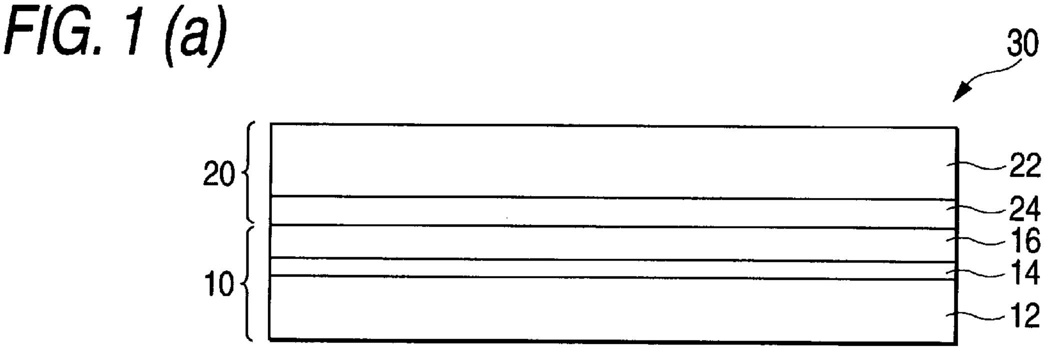
[FIGS. 1 (1(*a*), 1(*b*) and 1(*c*))]
Figure 1:
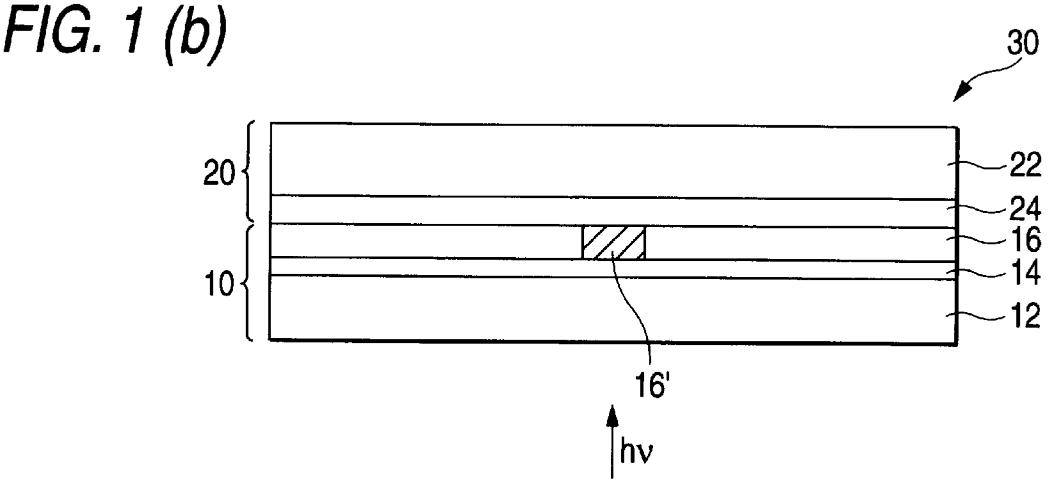
Figure 1:
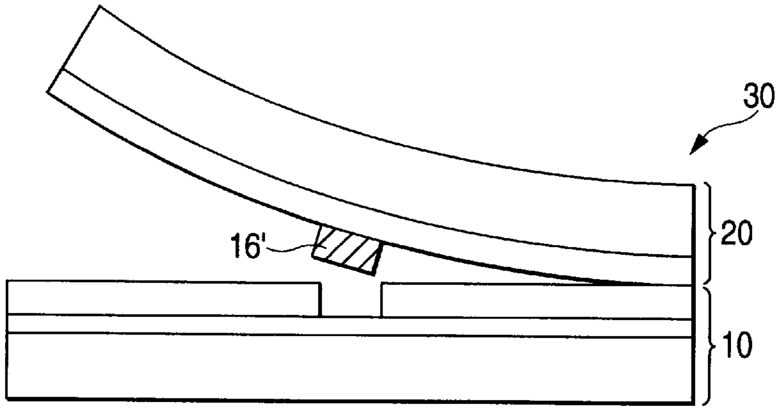

1 Recording device
2 Recording head
3 Sub-scanning rail
4 Recording drum
5 Thermal transfer sheet loading unit
6 Image-receiving sheet roll
7 Transportation roller
8 Squeeze roller
9 Cutter
10 Thermal transfer sheet
10K, 10C, 10M, 10y Thermal transfer sheet roll
12 Support
14 Light-to-heat conversion layer
16 Image-forming layer
20 Image-receiving sheet
22 Support for image-receiving sheet
24 Image-receiving layer
30 Laminate
31 Discharge bed
32 Discard port
33 Discharge port
34 Air
35 Discard box

DETAILED DESCRIPTION OF THE INVENTION

The multicolor image forming material of the present invention comprises a thermal transfer sheet and an image-receiving sheet and either one or both of the image-forming layer of the thermal transfer sheet and the image-receiving layer of the image-receiving sheet contains, as a fluorine-containing surfactant, a copolymer (I) comprising the repeating units (A), (B) and (C).

The multicolor image forming material of the present invention can be used for a multicolor image formation method which is described later. In this image formation, the image-forming layer of the thermal transfer sheet and the image-receiving layer of the image-receiving sheet are superposed to face each other, laser light is irradiated, and the region irradiated with laser light of the image-forming layer is transferred to the image-receiving layer of the image-receiving sheet, whereby an image is recorded. The image recorded on the image-receiving sheet is retransferred to printing paper.

In the repeating units (A), (B) and (C) constituting the copolymer (I) contained as a fluorine-containing surfactant in either one or both of the image-forming layer of the thermal transfer sheet and the image-receiving layer of the image-receiving sheet, x, y and z represent the molar fractions (%) of the repeating units (A), (B) and (C), respectively. x is from 10 to 80%, preferably from 20 to 60%, y is from 5 to 85%, preferably from 10 to 70%, z is from 5 to 85%, preferably from 10 to 70%. Here, x+y+z=100%.

In the repeating unit (A), n represents an integer of 1 to 10, preferably from 4 to 8.

In the repeating unit (B), PO represents $—CH_2CHCH_3O—$ (propylene oxide group), and s represents an integer of 2 to 18, preferably from 4 to 10.

In the repeating unit (C), EO represents $—CH_2CH_2O—$ (ethylene oxide group), and t represents an integer of 2 to 18, preferably from 4 to 10.

The mass average molecular weight of the copolymer (I) as a fluorine-containing surfactant is preferably from 5,000 to 70,000, more preferably from 10,000 to 50,000, still more preferably from 20,000 to 40,000. The mass average molecular weight as used herein is a polystyrene conversion value measured by gel permeation chromatography.

The copolymer (I) can be obtained by copolymerizing acryl-base monomers corresponding to respective repeating units using a normal radical polymerization method or the like. The molecular weight can be adjusted by a known method such as use of chain transfer agent or control of polymerization temperature.

The image-forming layer of the thermal transfer sheet and the image-receiving layer of the image-receiving sheet are formed by applying a coating solution for forming each layer and when the copolymer (I) is contained as a fluorine-containing surfactant in the coating solution, fitting to the surface of a material to be coated is improved and this prevents occurrence of, for example, a phenomenon that the coating solution is repelled on the surface of a material to be coated or a phenomenon that the solvent is not uniformly evaporated in the drying step after coating and the film thickness becomes non-uniform. As a result, the surface of the coated layer becomes uniform and stable transferability (sensitivity) can be obtained.

In the coating solution, the fluorine-containing surfactant is preferably blended in an amount of 0.005 to 1 part by mass, more preferably from 0.01 to 0.5 parts by mass.

As described above, the multicolor image forming material comprising a thermal transfer sheet and an image-receiving sheet of the present invention is used for the multicolor image formation method of the present invention. The multicolor image formation method of the present invention is described below in detail, and the thermal transfer sheet and the image-receiving sheet are described in more detail therein.

The multicolor image formation method of the present invention is effective and suitable for a system where a thermal transfer image formed of sharp dots can be realized and transfer on printing paper and B2-size recording (515 mm×728 mm, here, B2 size is 543 mm×765 mm) can be performed.

The thermal transfer image can be a halftone image in correspondence to the number of printing lines with a resolution of 2,000 to 2,540 dpi. Individual dots are almost free of blurring/missing and very sharply shaped and therefore, dots over a wide range from highlight to shadow can be clearly formed. As a result, a high-grade halftone image can be output with the same resolution as the image setter or CTP setter and the reproduced halftone image and gradation can have good approximation to the printed matter.

Furthermore, this thermal transfer image is favored with a sharp dot shape and therefore, a halftone image responding to a laser beam can be faithfully reproduced. Also, this thermal transfer image has recording property such that the dependency on the ambient temperature and humidity is very small, therefore, the color hue and the density both can be stably and repeatedly reproduced in an environment over a wide range of temperature and humidity.

This thermal transfer image is formed using a color pigment for use in the printing ink and has good repeated reproducibility, therefore, a high definition CMS (color management system) can be realized.

In addition, this thermal transfer image can be closely agreed with the color hue such as Japan color and SWOP color, namely, the color hue of a printed matter, and when the light source such as fluorescent lamp or incandescent lamp is changed, the viewing of color can provide the same change as in a printed matter.

In this thermal transfer image, the dot shape is sharp and therefore, thin lines of a fine letter can be sharply reproduced. The heat generated by laser light does not diffuse in the plane direction but is transmitted to the transfer interface and the image-forming layer is sharply broken at the interface of heated part/non-heated part, so that the light-to-heat conversion layer of the thermal transfer sheet can be rendered thin and the dynamic property of the image-forming layer can be controlled.

Incidentally, in a simulation, the light-to-heat conversion layer is estimated to momentarily reach about 700° C. and if the film is thin, deformation or destruction readily occurs. If deformation or destruction occurs, the light-to-heat conversion layer is transferred to the image-receiving sheet together with the transfer layer or a non-uniform transfer image is disadvantageously formed. On the other hand, for obtaining a predetermined temperature, a light-to-heat converting substance must be present in the film in a high concentration and this causes a problem such as precipitation of dye or migration of dye into an adjacent layer.

Therefore, the light-to-heat conversion layer is preferably rendered as thin as about 0.5 $\mu$m or less by selecting an infrared absorbing dye having excellent light-to-heat conversion property and a heat-resistant binder such as polyimide.

In general, if the light-to-heat conversion layer is deformed or the image-forming layer itself is deformed due to high temperature, the image-forming layer transferred to the image-receiving layer causes unevenness in the thickness correspondingly to the sub-scanning pattern of laser light, as a result, the image becomes non-uniform and the apparent transfer density decreases. This tendency is stronger as the thickness of the image-forming layer is smaller. If the thickness of the image-forming layer is large, the sharpness of dot is impaired and the sensitivity becomes low.

In order to attain both of these contradictory performances, a low melting point substance such as wax is preferably added to the image-forming layer to improve the transfer unevenness. Also, an inorganic fine particle may be added in place of the binder to properly increase the layer thickness and attain sharp breakage of the image-forming layer at the interface of heated part/non-heated part, so that the transfer unevenness can be improved while maintaining the sharpness of dot and the sensitivity.

The low melting point substance such as wax is generally liable to bleed out to the image-forming layer surface or undertake crystallization and sometimes causes a problem in the image quality or aging stability of the thermal transfer sheet.

In order to solve these problems, a low melting point substance having a small difference in the Sp value from the polymer of the image-forming layer is preferably used. By using such a substance, the compatibility with the polymer is increased and separation of the low melting point substance from the image-forming layer can be prevented. Also, several kinds of low melting point substances differing in the structure are preferably mixed to form an eutectic crystal and prevent crystallization, whereby an image having a sharp dot shape and reduced in the unevenness can be obtained.

Furthermore, if the coated layer of the thermal transfer sheet absorbs moisture, the dynamic property and thermal property of the layer are changed to bring about dependency on humidity in the recording environment.

In order to reduce this dependency on temperature and humidity, an organic solvent system is preferably used for the dye/binder system of the light-to-heat conversion layer and for the binder system of the image-forming layer. It is also preferred to select polyvinyl butyral as the binder of the image-receiving layer and at the same time, introduce a polymer hydrophobizing technique so as to reduce the water absorptivity of the polymer. Examples of the polymer hydrophobizing technique include a technique of reacting a hydroxyl group with a hydrophobic group described in JP-A-8-238858 and a technique of crosslinking two or more hydroxyl groups with a hardening agent.

Usually, the image-forming layer is also heated to about 500° C. or more at the printing by the exposure with laser light and pigments heretofore used are thermally decomposed in some cases. This can be prevented by employing a highly heat-resistant pigment in the image-forming layer.

If the infrared absorbing dye migrates into the image-forming layer from the light-to-heat conversion layer due to heat of high temperature at the printing, the color hue is changed. In order to prevent this, the light-to-heat conversion layer is preferably designed using an infrared absorbing dye/binder combination having a strong holding power as described above.

In general, energy shortage occurs at the high-speed printing and gaps particularly corresponding to intervals of the laser sub-scanning are generated. As described above, efficiency in the generation/transmission of heat can be elevated by increasing the concentration of the dye in the light-to-heat conversion layer and reducing the thickness of the light-to-heat conversion layer image-forming layer. Furthermore, for the purpose of slightly fluidizing the image-forming layer at the heating to fill the gaps and strengthening the adhesion to the image-receiving layer, a low melting point substance is preferably added to the image-forming layer. Also, for intensifying the adhesion between the image-receiving layer and the image-forming layer and imparting a sufficiently high strength to the transferred image, for example, the same polyvinyl butyral as used in the image-forming layer is preferably employed for the binder of the image-receiving layer.

The image-receiving sheet and the thermal transfer sheet are preferably held on a drum by vacuum adhesion. This vacuum adhesion is important because the image is formed by controlling the adhesive strength between two sheets and the image transfer behavior is very sensitive to the clearance between the image-receiving layer surface of the image-receiving sheet and the image-forming layer surface of the transfer sheet. When widening of the clearance between materials is triggered by a foreign matter such as dust, this causes image defects or image transfer unevenness.

In order to prevent such image defects or image transfer unevenness, uniform asperities are preferably formed on the thermal transfer sheet to smoothly pass air and obtain a uniform clearance.

The asperities may be formed on the thermal transfer sheet by a post-treatment such as embossing or by the addition of a matting agent to the coated layer. In view of simplification of the production process and aging stability of the material, addition of a matting agent is preferred. The matting agent must be larger than the thickness of the coated layer. If the matting agent is added to the image-forming layer, there arises a problem that the image in the portion where the matting is present is missed. Therefore, a matting agent having an optimal particle size is preferably added to the light-to-heat conversion layer, whereby the image-forming layer itself can have an almost uniform thickness and an image free of defects can be obtained on the image-receiving sheet.

In order to reproduce the above-described sharp dots without fail, a high-precision design is required also in the recording device side. The fundamental constitution is same as the conventional laser thermal transfer recording device. This constitution is a so-called heat-mode outer drum recording system where a recording head with a plurality of high-power lasers irradiates laser light on a thermal transfer sheet and an image-receiving sheet, which are fixed on a drum, and thereby an image is recorded. In particular, the following embodiments are preferred.

The image-receiving sheet and thermal transfer sheet are fed by full automatic roll feeding. The image-receiving sheet and thermal transfer sheet are fixed on a recording drum by vacuum adsorption. A large number of vacuum adsorption holes are formed on a recording drum and the sheet is adsorbed to the drum by reducing the pressure inside the drum using a blower or a pressure reducing pump. The thermal transfer sheet is further adsorbed over the image-receiving sheet which is already adsorbed. Therefore, the size of the heat-transfer sheet is made larger than that of the image-receiving sheet. The air between the thermal transfer sheet and the image-receiving sheet, which most greatly affects the recording performance, is suctioned from the area outside the image-receiving sheet, where only the thermal transfer sheet is adsorbed.

In this device, many large-area sheets of B2 size can be accumulated one on another in the discharge bed. For this purpose, a method of blowing an air between two sheets and floating the sheet which is discharged later is employed.

Figure 2:
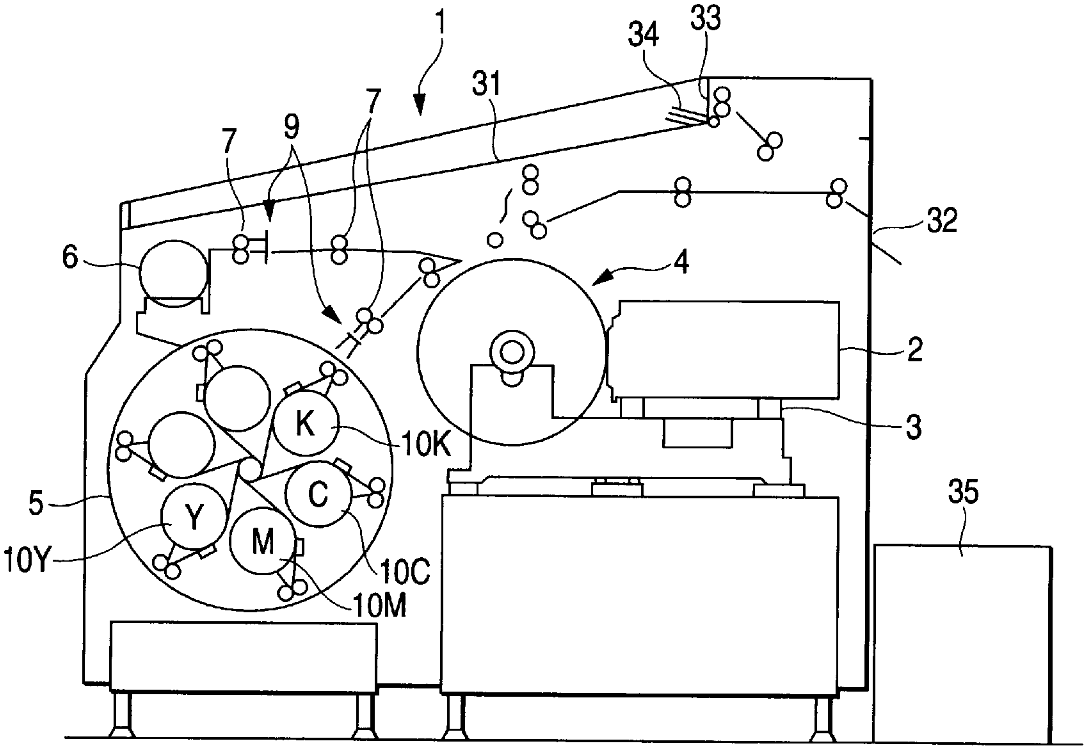
[FIG. 2]

FIG. 2 shows a constitution example of this device.

The sequence in this device is described below.

1) In a recording device 1, the sub-scan axis of the recording head 2 is returned to the original point by means of a subs-scan rail 3, and the main scan rotation axis of the recording drum 4 and the thermal transfer sheet loading unit 5 are also returned to respective original points.

2) An image-receiving sheet roll 6 is untied by a transportation roller 7 and the leading end of the image-receiving sheet is vacuum-suctioned through suction holes provided on a recording drum 4 and fixed on the recording drum.

3) A squeeze roller 8 comes down on the recording drum 4 to press the image-receiving sheet and stops pressing when a predetermined amount of the image-receiving sheet is transported by the rotation of the drum, and the image-receiving sheet is cut by a cutter 9 to a predetermined length.

4) The recording drum 4 continues rotating to make one rotation and thereby, the loading of the image-receiving sheet is completed.

5) In the same sequence as that for the image-receiving sheet, a thermal transfer sheet K having a first color (black) is drawn out from a thermal transfer sheet roll 10K and cut to complete the loading. 6) Then, the recording drum 4 starts rotating at a high speed, the recording head 2 on the sub-scan rail 3 starts moving and when the recording head reaches a recording start position, a recording laser is irradiated on the recording drum 4 by the recording head 2 according to the recording image signals. The irradiation is finished at the recording end position and the moving of sub-scan rail and the rotation of drum are stopped. The recording head on the sub-scan rail is returned to the original point.

7) While leaving the image-receiving sheet on the recording drum, only the thermal transfer sheet K is peeled off. The leading end of the thermal transfer sheet K was hooked by a nail, pulled out in the discharge direction and discarded to the discard box 35 through the discard port 32.

8) 5) to 7) are repeated for transferring remaining three color portions. The recording order subsequent to black is cyan, magenta and then yellow. More specifically, a thermal transfer sheet C having a second color (cyan), a thermal transfer sheet M having a third color (magenta) and a thermal transfer sheet Y having a fourth color (yellow) are sequentially drawn out from a thermal transfer sheet roll 10C, a thermal transfer sheet roll 10M and a thermal transfer sheet roll 10Y, respectively. The transfer order is opposite to the general printing order and this is because at the transfer on the printing paper in the later step, the color order on the printing paper is reversed.

9) After the completion of transfer of four colors, the recorded image-receiving sheet is finally discharged to a discharge bed 31. The peeling off of the image-receiving sheet from the drum is performed in the same manner as the thermal transfer sheet in 7), however, unlike the thermal transfer sheet, the image-receiving sheet is not discarded and therefore, when transported until the discard port 32, the image-receiving sheet is returned to the discharge bed by means of switch back. On discharging the image-receiving sheet in the discharge bed, an air 34 is blown from the lower part of the discharge port 33, so that a plurality of sheets can be accumulated.

An adhesive roller having provided on the surface thereof an adhesive material is preferably used for any one transportation roller 7 disposed at the positions of feeding or transporting the thermal transfer sheet roll or the image-receiving sheet roll.

By providing an adhesive roller, the surfaces of the thermal transfer sheet and the image-receiving sheet can be cleaned.

Examples of the adhesive material provided on the surface of the adhesive roller include an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic acid ester copolymer, a polyester resin, a polyurethane resin, an acrylic resin, a butyl rubber and polynobornene.

The adhesive roller is put into contact with the surface of the thermal transfer sheet or the image-receiving sheet, whereby the surface of the thermal transfer sheet or the image-receiving sheet can be cleaned. The contact pressure is not particularly limited as long as the roller is contacted with the sheet.

The absolute value of the difference between the surface roughness Rz on the image-forming layer surface of the thermal transfer sheet and the surface roughness Rz on the surface of the backside layer thereof is preferably 3.0 or less, and the absolute value of the difference between the surface roughness Rz on the image-receiving layer surface of the image-receiving sheet and the surface roughness Rz on the surface of the backside layer thereof is preferably 3.0 or less. By having such a constitution in combination with the above-described cleaning means, the generation of image defects and the jamming of sheets on transportation can be prevented and the dot gain stability can be improved.

The surface roughness Rz as used in the present invention means a ten point average surface roughness corresponding to Rz (maximum height) defined by JIS and this is determined as follows. A basic area portion is extracted from the roughness curved surface and using an average face in this portion as the basic face, the distance between the average altitude of peaks from the highest to the fifth height and the average depth of troughs from the deepest to the fifth depth is input and converted. For the measurement, a probe-system three-dimensional roughness meter (Surfcom 570A-3DF) manufactured by Tokyo Seimitsu Co., Ltd. is used. The measured direction is longitudinal direction, the cut-off value is 0.08 mm, the measured area is 0.6 mm×0.4 mm, the feed pitch is 0.005 mm and the measurement speed is 0.12 mm/s.

From the standpoint of more enhancing the above-described effects, the absolute value of difference between the surface roughness Rz on the image-forming layer surface of the thermal transfer sheet and the surface roughness Rz on the surface of the backside layer thereof is preferably 1.0 or less and the absolute value of difference between the surface roughness Rz on the image-receiving layer surface of the image-receiving sheet and the surface roughness Rz on the surface of the backside layer thereof is preferably 1.0 or less.

In another embodiment, the image-forming layer surface of the thermal transfer sheet and the surface of the backside layer thereof and/or the front and back surfaces of the image-receiving sheet preferably have a surface roughness Rz of 2 to 30 μm. By having such a constitution in combination with the above-described cleaning means, the generation of image defects and the jamming of sheets on transportation can be prevented and the dot gain stability can be improved.

The glossiness on the image-forming layer of the thermal transfer sheet is preferably from 80 to 99.

The glossiness greatly depends on the smoothness on the surface of the image-forming layer and affects the uniformity in the layer thickness of the image-forming layer. With higher glossiness, the image-forming layer can be more uniform and more suitable for uses of forming a high definition image, however, if the smoothness is higher, the resistance at the transportation becomes larger. Thus, the smoothness and the resistance are in the trade-off relationship but these can be balanced when the glossiness is from 80 to 99.

The material having tackiness for use on the adhesive roller preferably has a Vickers hardness Hv of 50 $kg/mm^2$ (about 490 MPa) or less, because dusts as a foreign matter can be satisfactorily removed and the generation of image defects can be prevented.

The Vickers hardness is a hardness obtained when a static load is imposed on a regular quadrangular pyramid- shaped diamond indenter having a diagonal angle of 136° and the hardness is measured. The Vickers hardness Hv can be determined by the following formula:

$$\text{Hardness } Hv=1.854P/d^2(\text{kg/mm}^2)=\text{about } 18.1692d^2 \text{ (MPa)}$$

wherein

P: size of load (kg), d: length of diagonal line of square recession (mm).

In the present invention, the material having tackiness for use on the adhesive roller preferably has an elastic modulus of 200 $kg/cm^2$ (about 19.6 MPa) or less at 20° C., because, similarly to the above, dusts as a foreign matter can be satisfactorily removed and the generation of image defects can be prevented.

The mechanism of forming a multicolor image by the thermal transfer of a thin film using a laser is roughly described below by referring to FIG. 1.

On the surface of an image-forming layer 16 containing a pigment of black (K), cyan (C), magenta (M) or yellow (Y) of a thermal transfer sheet 10, an image-receiving sheet 20 is stacked to prepare an image-forming laminate 30. The thermal transfer sheet 10 comprises a support 12 having thereon a light-to-heat conversion layer 14 and further thereon an image-forming layer 16, and the image-receiving sheet 20 comprises a support 22 having thereon an image-receiving layer 24 and is stacked to bring the image-receiving layer 24 into contact with the surface of the image-forming layer 16 of the thermal transfer sheet 10 (see, FIG. 1(*a*)). When laser light is imagewise irradiated in time series on the obtained laminate 30 from the support 12 side of the thermal transfer sheet 10, the light-to-heat conversion layer 14 of the thermal transfer sheet 10 in the region irradiated with the laser light generates heat and decreases in the adhesive strength with the image-forming layer 16 (see, FIG. 1(*b*)). Thereafter, the image-receiving sheet 20 and the thermal transfer sheet 10 are peeled off, then, the image-forming layer 16 in the region 16' irradiated with the laser light is transferred onto the image-receiving layer 24 of the image-receiving sheet 20 (see FIG. 1(*c*)).

In the multicolor image formation, the laser light used for the light irradiation is preferably multibeam laser light, more preferably light of multibeam two-dimensional arrangement. The multibeam two-dimensional arrangement means that on performing the recording by laser irradiation, a plurality of laser beams are used and the spot arrangement of these laser beams forms a two-dimensional plane arrangement comprising a plurality of rows along the main scanning direction and a plurality of lines along the sub-scanning direction.

By using the laser light of multibeam two-dimensional arrangement, the time period necessary for the laser recording can be shortened.

Any laser light can be used without particular limitation as long as it is multibeam laser light. For example, a gas laser light such as argon ion laser light, helium-neon laser light and helium-cadmium laser light, a solid-state laser light such as YAG laser light, or a direct laser light such as semiconductor laser light, dye laser light and excimer laser light, is used. In addition, for example, light converted into a half wavelength by passing the above-described laser light through a secondary higher harmonic device may also be used. In the multicolor image formation method, semiconductor laser light is preferably used on considering the output power and the easiness of modulation. In the multicolor image formation method, the laser light is preferably irradiated under the conditions of giving a beam diameter of 5 to 50 μm (particularly from 6 to 30 μm) on the light-to-heat conversion layer. The scanning speed is preferably 1 m/sec or more (particularly 3 m/sec or more).

In the multicolor image formation, the thickness of the image-forming layer in the black thermal transfer sheet is preferably larger than that of the image-forming layer in each of yellow, magenta and cyan thermal transfer sheets and is preferably from 0.5 to 0.7 μm. By constituting as such, the reduction in density due to transfer unevenness can be suppressed at the irradiation of laser on the black thermal transfer sheet.

If the layer thickness of the image-forming layer in the black thermal transfer sheet is less than 0.5 μm, the image density is greatly reduced due to transfer unevenness on recording with a high energy and an image density necessary as a proof for printing may not be achieved. This tendency is stronger under high humidity conditions and the density is greatly changed depending on the environment. On the other hand, if the layer thickness exceeds 0.7 μm, the transfer sensitivity is decreased at the laser recording and poor fixing of small points or thinning of fine lines may occur. This tendency is stronger under low humidity conditions. Also, the resolution may be worsened. The layer thickness of the image-forming layer in the black thermal transfer sheet is more preferably from 0.55 to 0.65 μm, still more preferably 0.60 μm.

Furthermore, it is preferred that the layer thickness of the image-forming layer in the black thermal transfer sheet is from 0.5 to 0.7 μm and the layer thickness of the image-forming layer in each of the yellow, magenta and cyan thermal transfer sheets is from 0.2 μm to less than 0.5 μm.

If the layer thickness of the image-forming layer in each of the yellow, magenta and cyan thermal transfer sheets is less than 0.2 μm, the density may decrease due to transfer unevenness at the laser recording, whereas if the layer thickness is 0.5 μm or more, the transfer sensitivity or the resolution may decrease. The layer thickness is more preferably from 0.3 to 0.45 μm.

In the present invention, the ratio (OD/layer thickness) of the optical density (OD) and the layer thickness of the light-to-heat conversion layer is preferably 0.57 or more, more preferably 1 or more, still more preferably 1.50 or more. The ratio (OD/layer hickness) of the optical density (OD) and the layer thickness of the image-forming layer is preferably 1.80 or ore, more preferably 2.50 or more.

The image-forming layer in the black thermal transfer sheet preferably contains carbon black. The carbon black preferably comprises at least two kinds of carbon blacks differing in the staining power, because the reflection density can be adjusted while keeping constant the P/B (pigment/binder) ratio.

The staining power of carbon black is expressed by various methods and, for example, PVC blackness described in JP-A-10-140033 may be used. The PVC blackness is determined as follows. Carbon black is added to PVC resin, dispersed by means of a twin roller and formed into a sheet and by setting the base values that the blackness of Carbon Black "#40" and "#45" produced by Mitsubishi Chemical is Point 1 and Point 10, respectively, the blackness of the sample is evaluated by the judgement with an eye. Two or more carbon blacks differing in the PVC blackness can be appropriately selected and used according to the purpose.

The method for preparing a sample is specifically described below.

Production Method of Sample

In a 250 ml-volume Banbury mixer, 40 mass % of a sample carbon black is blended with LDPE (low-density polyethylene) resin and kneaded at 115° C. for 4 minutes.

| Blending Conditions: | |
|---|---|
| LDPE resin | 101.89 g |
| Calcium stearate | 1.39 g |
| Irganox 1010 | 0.87 g |
| Sample carbon black | 69.43 g |

Then, the kneaded material is diluted at 120° C. using a twin roller mill to a carbon black concentration of 1 mass %.

| Conditions in Production of Diluted Compound: | |
|---|---|
| LDPE resin | 58.3 g |
| Calcium stearate | 0.2 g |
| Resin having blended therein 40 mass % of carbon black | 1.5 g |

The diluted compound is processed into a sheet form through a 0.3 mm-width slit and the obtained sheet is cut into chips and formed into a film of 65±3 μm on a hot plate at 240° C.

In forming a multicolor image, the multicolor image may be formed by a method of using, as described above, thermal transfer sheets and repeatedly superposing many image layers (image-forming layers having formed thereon an image) on the same image-receiving sheet or by a method of once forming an image on each image-receiving layer of a plurality of image-receiving sheets and re-transferring the images to printing paper or the like.

In the latter method, for example, thermal transfer sheets differing in the color hue of the coloring material contained in the image-forming layer are prepared and four kinds (four colors: cyan, magenta, yellow and black) of laminates for image formation are produced by combining each thermal transfer sheet with an image-receiving sheet. On each laminate, for example, laser light is irradiated through a color separation filter according to digital signals based on an image and subsequently, the thermal transfer sheet is separated from the image-receiving sheet to independently form a color separation image of each color on each image-receiving sheet. Respective color separation images formed are sequentially stacked on a separately prepared actual support such as printing paper or on a support approximated thereto, whereby a multicolor image can be formed.

In the thermal transfer recording using laser light irradiation, the state of pigment, dye or image-forming layer at the transfer is not particularly limited insofar as a laser beam can be converted into heat, the image-forming layer containing a pigment can be transferred to an image-receiving sheet by making use of the heat energy and an image can be formed on the image-receiving sheet. examples of the state include solid state, softened state, liquid state and gas state and although the pigment, dye or image-forming layer may be changed into any of these states, from solid to softened state is preferred. The thermal transfer recording using laser light irradiation includes, for example, conventionally known fusion-type transfer, transfer using ablation, and sublimation-type transfer.

Among these, the above-described thin-film transfer type and the fusion/ablation type are preferred, because an image having color hues analogous to printing is formed.

After an image is printed on the image-receiving sheet in a recording device, the process of transferring the image-receiving sheet to a printing paper sheet (hereinafter referred to as "printing paper") is usually performed by using a heat laminator. The image-receiving sheet is superposed on a printing paper and then, heat and pressure are applied thereon to bond these sheets. Thereafter, the image-receiving sheet is peeled off from the printing paper, as a result, only the image-receiving layer containing an image remains on the printing paper.

By connecting the above-described device to a plate-making system, a system capable of exerting a function as a color proof can be established. The system is required to output, from the recording device, a print having an image quality immensely close to that of a printed matter output based on certain plate-making data. For realizing this, a software for approximating colors and halftone dots to those of a printed matter is necessary. The connection example is specifically described below.

In the case of obtaining a proof of a printed matter from a plate-making system (for example, Celebra manufactured by Fuji Photo Film Co., Ltd.), the system is connected as follows. A CTP (computer-to-plate) system is connected to the plate-making system. A printing plate output therefrom is mounted on a press and a final printed matter is obtained. The plate-making system is connected with the above-described recording device as a color proof and between these, PD System (registered trademark) is connected as a proof drive software for approximating colors and halftone dots to those of a printed matter.

The contone (continuous tone) data converted into raster data in the plate-making system are converted into binary data for halftone dots, output to the CTP system and finally printed. On the other hand, the same contone data are output also to the PD System. The PD System converts the received data using a four-dimensional (black, cyan, magenta and yellow) table to give colors agreeing with those of the printed matter and finally converts the data into binary data for halftone dots to give halftone dots agreeing with those of the printed matter. These data are output to the recording device.

The four-dimensional table is previously prepared by performing an experiment and stored in the system. The experiment for preparation of the table is performed as follows. After preparing an image printed through a CTP system from important color data and an image output to the recording device through the PD System and comparing the measured color values, a table is prepared such that the difference in the measured color values is minimized.

The thermal transfer sheet and the image-receiving sheet which are suitably used for the recording device in the above-described system are described below.

[Thermal Transfer Sheet]

The thermal transfer sheet has at least a light-to-heat conversion layer and an image-forming layer on a support and if desired, additionally has other layers. In the present invention, the above-described fluorine-containing surfactant, namely, the copolymer (I) may be blended in the image-forming layer. This is described in detail above.

(Support)

The material for the support of the thermal transfer sheet is not particularly limited and various support materials may be used according to the purpose. The support preferably has rigidity, good dimensional stability and durability against heat at the image formation. Preferred examples of the support material include synthetic resin materials such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymer, (aromatic or aliphatic) polyamide, polyimide, polyamidoimide and polysulfone. Among these, biaxially stretched polyethylene terephthalate is preferred in view of the mechanical strength and dimensional stability against heat. In the case of use for the manufacture of a color proof using laser recording, the support of the thermal transfer sheet is preferably formed of a transparent synthetic resin material capable of transmitting laser light. The thickness of the support is preferably from 25 to 130 $\mu$m, more preferably from 50 to 120 $\mu$m. The center line average surface roughness Ra (measured according to JIS B0601 using a surface roughness meter (Surfcom, manufactured by Tokyo Seimitsu Co., Ltd.)) of the support in the image-forming layer side is preferably less than 0.1 $\mu$m. The Young's modulus in the longitudinal direction of the support is preferably from 200 to 1,200 kg/mm$^2$ (about 2 to 12 GPa) and the Young's modulus in the cross direction is preferably from 250 to 1,600 kg/mm$^2$ (about 2.5 to 16 GPa). The F-5 value in the longitudinal direction of the support is preferably from 5 to 50 kg/mm$^2$ (about 49 to 490 MPa) and the F-5 value in the cross direction of the support is preferably from 3 to 30 kg/mm$^2$ (about 29.4 to 294 MPa). The F-5 value in the longitudinal direction of the support is generally higher than the F-5 value in the cross direction of the support but this does not apply when the strength particularly in the cross direction must be high. The heat shrinkage percentage at 100° C. for 30 minutes in the longitudinal and cross directions of the support is preferably 3% or less, more preferably 1.5% or less, and the heat shrinkage at 80° C. for 30 minutes is preferably 1% or less, more preferably 0.5% or less. The breaking strength is preferably from 5 to 100 kg/mm$^2$ (about 49 to 980 MPa) in both directions and the elastic modulus is preferably from 100 to 2,000 kg/mm$^2$ (about 0.98 to 19.6 GPa).

The support of the thermal transfer sheet may be subjected to a surface activation treatment and/or a treatment of providing one or more undercoat layer so as to improve the adhesive property to the light-to-heat conversion layer provided on the support. Examples of the surface activation treatment include a glow discharge treatment and a corona discharge treatment. The material for the undercoat layer preferably exhibits high adhesive property to both surfaces of the support and the light-to-heat conversion layer and has small heat conductivity and excellent heat resistance. Examples of such a material for the undercoat layer include styrene, styrene-butadiene copolymers and gelatin. The thickness of the entire undercoat layer is usually from 0.01 to 2 μm. If desired, the surface of the thermal transfer sheet in the side opposite the side where the light-to-heat conversion layer is provided may be subjected to a treatment of providing various functional layers such as antireflection layer and antistatic layer, or to a surface treatment.

(Back Layer)

A back layer is preferably provided on the surface of the thermal transfer sheet of the present invention in the side opposite the side where the light-to-heat conversion layer is provided. The back layer is preferably constituted by two layers, namely, a first back layer adjacent to the support and a second back layer provided on the first back layer in the side opposite the support. In the present invention, the ratio B/A of the mass A of the antistatic agent contained in the first back layer to the mass B of the antistatic agent contained in the second back layer is preferably less than 0.3. If the B/A ratio is 0.3 or more, the slipping property and the powder falling from the back layer are liable to change for the worse.

The layer thickness C of the first back layer is preferably from 0.01 to 1 μm more preferably from 0.01 to 0.2 μm. The layer thickness D of the second back layer is preferably from 0.01 to 1 μm, more preferably from 0.01 to 0.2 μm. The ratio C:D in the film thickness between these first and second back layers is preferably from 1:2 to 5:1.

Examples of the antistatic agent which can be used in the first and second back layers include nonionic surfactants such as polyoxyethylene alkylamine and glycerol fatty acid ester, cationic surfactants such as quaternary ammonium salt, anionic surfactants such as alkyl phosphate, amphoteric surfactants, and compounds such as electrically conducting resin.

An electrically conducting fine particle can also be used as the antistatic agent. Examples of the electrically conducting fine particle include oxides such as $ZnO$, $TiO_2$, $SnO_2$, $Al_2O_3$, $In_2O_3$, $MgO$, $BaO$, $CoO$, $CuO$, $Cu_2O$, $CaO$, $SrO$, $BaO_2$, $PbO$, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as $CuS$ and $ZnS$; carbides such as $SiC$, $TiC$, $ZrC$, $VC$, $NbC$, $MoC$ and $WC$; nitrides such as $Si_3N_4$, $TiN$, $ZrN$, $VN$, $NbN$ and $Cr_2N$; borides such as $TiB_2$, $ZrB_2$, $NbB_2$, $TaB_2$, $CrB$, $MoB$, $WB$ and $LaB_5$; silicides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and composite materials such as $SiN_4$—$SiC$ and $9Al_2O_3$-$2B_2O_3$. These particles may be used individually or in combination of two or more thereof. Among these, $SnO_2$, $ZnO$, $Al_2O_3$, $TiO_2$, $In_2O_3$, $MgO$, $BaO$ and $MoO_3$ are preferred, $SnO_2$, $ZnO$, $In_2O_3$ and $TiO_2$ are more preferred, and $SnO_2$ is still more preferred.

In the case of using the thermal transfer material of the present invention for the laser thermal transfer system, the antistatic agent used in the back layer is preferably substantially transparent so that the laser light can be transmitted.

In the case of using an electrically conducting metal oxide as the antistatic agent, the particle size thereof is preferably smaller so as to reduce the light scattering as much as possible, however, the particle size must be determined using, as a parameter, the ratio in the refractive index between the particle and the binder and can be obtained using the Mie Scattering Theory. The average particle size is generally from 0.001 to 0.5 μm, preferably from 0.003 to 0.2 μm. The average particle size as used herein is a value including not only a primary particle size of the electrically conducting metal oxide but also a particle size of higher structures.

In addition to the antistatic agent, various additives such as surfactant, slipping agent and matting agent, and a binder may be added to the first and second back layers. The amount of the antistatic agent contained in the first back layer is preferably from 10 to 1,000 parts by mass, more preferably from 200 to 800 parts by mass, per 100 parts by mass of the binder. The amount of the antistatic agent contained in the second back layer is preferably from 0 to 300 parts by mass, more preferably from 0 to 100 parts by mass, per 100 parts by mass of the binder.

Examples of the binder which can be used in the formation of first and second back layers include homopolymers and copolymers of acrylic acid-based monomers such as acrylic acid, methacrylic acid, acrylic acid ester and methacrylic acid ester; cellulose-base polymers such as nitrocellulose, methyl cellulose, ethyl cellulose and cellulose acetate; vinyl-base polymers and copolymers of vinyl compounds, such as polyethylene, polypropylene, polystyrene, vinyl chloride copolymer, vinyl chloride-vinyl acetate copolymer, polyvinylpyrrolidone, polyvinyl butyral and polyvinyl alcohol; condensed polymers such as polyester, polyurethane and polyamide; rubber-base thermoplastic polymers such as butadiene-styrene copolymer; polymers obtained by polymerizing or crosslinking a photopolymerizable or thermopolymerizable compound such as epoxy compound; and melamine compounds.

(Light-to-Heat Conversion Layer)

The light-to-heat conversion layer contains a light-to-heat converting substance, a binder and if desired, a matting agent. Furthermore, if desired, the light-to-heat conversion layer contains other components.

The light-to-heat converting substance is a substance having a function of converting energy of the irradiated light into heat energy. This substance is generally a dye (including a pigment, hereinafter the same) capable of absorbing laser light. In the case of performing the image recording using an infrared laser, an infrared absorbing dye is preferably used as the light-to-heat converting substance. Examples of the dye include black pigments such as carbon black; pigments formed of a macrocyclic compound having absorption in the region from visible to near infrared, such as phthalocyanine and naphthalocyanine; organic dyes used as a laser-absorbing material in the high-density laser recording such as optical disk (for example, cyanine dyes such as indolenine dye, anthraquinone-base dyes, azulene-base dyes and phthalocyanine-base dyes); and organometallic compound dyes such as dithiol-nickel complex. Among these, cyanine-base dyes are preferred because this dye exhibits a high absorption coefficient to light in the infrared region and when used as a light-to-heat converting substance, the thickness of the light-to-heat conversion layer can be reduced, as a result, the recording sensitivity of the thermal transfer sheet can be more improved.

Other than the dye, particulate metal materials such as blacked silver, and inorganic materials may also be used as the light-to-heat converting substance.

The binder contained in the light-to-heat conversion layer is preferably a resin having at least a strength sufficiently large to form a layer on a support and having a high heat conductivity. A resin having heat resistance and incapable of decomposing even by the heat generated from the light-to-heat converting substance on image recording is more preferred, because even when light irradiation of high energy is performed, the smoothness on the surface of the light-to-heat conversion layer can be maintained after the light irradiation. More specifically, a resin having a thermal decomposition temperature (a temperature of giving a mass decrement of 5% in an air stream at a temperature-rising rate of 10° C./min according to the TGA method (thermogravimetric analysis)) of 400° C. or more is preferred and a resin having the thermal decomposition temperature of 500° C. or more is more preferred. Also, the binder preferably has a glass transition temperature of 200 to 400° C., more preferably from 250 to 350° C. If the glass transition temperature is less than 200° C., fogging may be generated on the formed image, whereas if it exceeds 400° C., the solubility of the resin decreases and the production efficiency may be lowered.

The heat resistance (for example, thermal deformation temperature or thermal decomposition temperature) of the binder in the light-to-heat conversion layer is preferably higher as compared with the materials used in other layers provided on the light-to-heat conversion layer.

Specific examples of the binder include acrylic acid-base resin (e.g., polymethyl methacrylate), polycarbonate, polystyrene, vinyl-base resin (e.g., vinyl chloride/vinyl acetate copolymer, polyvinyl alcohol), polyvinyl butyral, polyester, polyvinyl chloride, polyamide, polyimide, polyether imide, polysulfone, polyether sulfone, aramid, polyurethane, epoxy resin and urea/melamine resin. Among these, polyimide resin is preferred.

In particular, the polyimide resins represented by the following formulae (I) to (VII) are preferred, because these resins are soluble in an organic solvent and when such a polyimide resin is used, the productivity of thermal transfer sheet is improved. Use of these polyimide resins is preferred also in view of improvement in the viscosity stability, long-term storability and humidity resistance of the coating solution for the light-to-heat conversion layer.

(I)

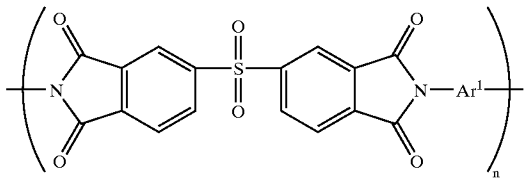

-continued (II)

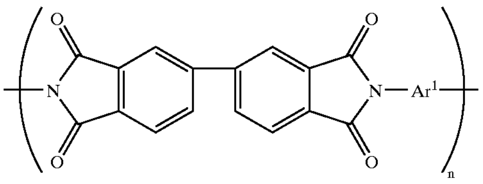

wherein $Ar^1$ represents an aromatic group represented by the following structural formula (1), (2) or (3), and n represents an integer of 10 to 100:

(1)

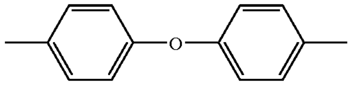

(2)

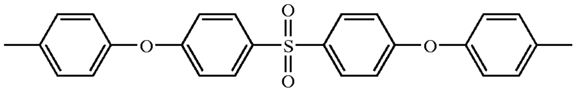

(3)

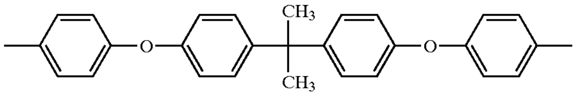

(III)

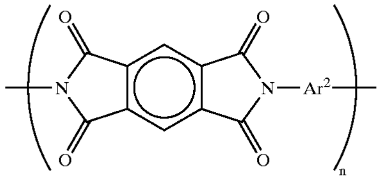

(IV)

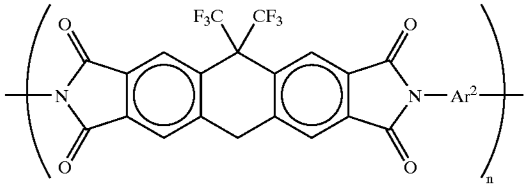

wherein $Ar^2$ represents an aromatic group represented by the following formula (4), (5), (6) or (7), and n represents an integer of 10 to 100:

(4)

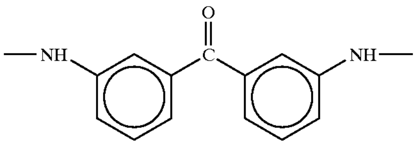

(5)

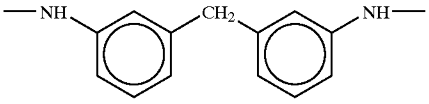

-continued (6)

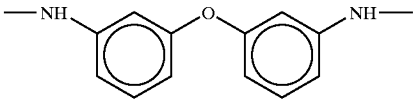

(7)

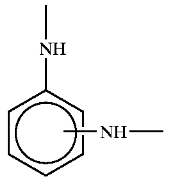

(V)

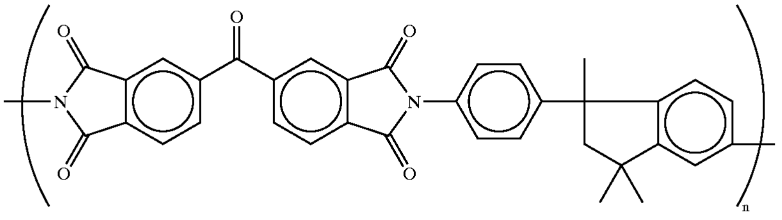

(VI)

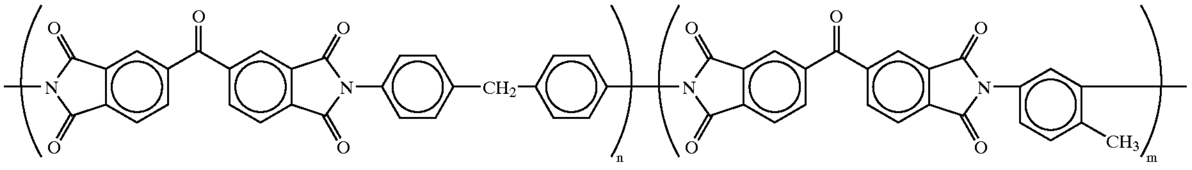

(VII)

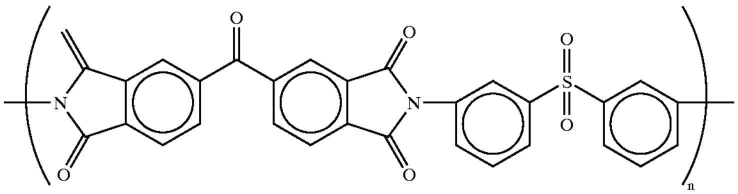

wherein in formulae (V) to (VII), n and m each represents an integer of 10 to 100, and in formula (VI), the ratio n:m is from 6:4 to 9:1.

As for the standard for the judgement whether or not the resin is soluble in an organic solvent, on the basis that 10 parts by mass of resin dissolves at 25° C. per 100 parts by mass of N-methylpyrrolidone, when 10 parts by mass of resin is dissolved, the resin is preferably used as the resin for the light-to-heat conversion layer. When 100 parts by mass of resin is dissolved per 100 parts by mass of N-methylpyrrolidone, this resin is more preferred.

Examples of the matting agent contained in the light-to-heat conversion layer include an inorganic fine particle and an organic fine particle. Examples of the inorganic fine particle include metal salts such as silica, titanium oxide, aluminum oxide, zinc oxide, magnesium oxide, barium sulfate, magnesium sulfate, aluminum hydroxide, magnesium hydroxide and boron nitride, kaolin, clay, talc, zinc white, white lead, zieklite, quartz, kieselguhr, pearlite, bentonite, mica and synthetic mica. Examples of the organic fine particle include resin particles such as fluororesin particle, guanamine resin particle, acrylic resin particle, styrene-acryl copolymer resin particle, silicone resin particle, melamine resin particle and epoxy resin particle.

The particle size of the matting agent is usually from 0.3 to 30 μm, preferably from 0.5 to 20 μm, and the amount of the matting agent added is preferably 0.1 to 100 mg/$m^2$.

The light-to-heat conversion layer may contain, if desired, a surfactant, a thickener, an antistatic agent and the like.

The light-to-heat conversion layer can be provided by preparing a coating solution having dissolved therein a light-to-heat converting substance and a binder and if desired, having added thereto a matting agent and other components, applying the coating solution onto a support and drying the solution. Examples of the organic solvent for dissolving the polyimide resin include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethylsulfoxide, dimethylformamide, dimethylacetamide, γ-butyrolactone, ethanol and methanol. The coating and drying may be performed using ordinary coating and drying methods. The drying is usually performed at a temperature of 300° C. or less, preferably at a temperature of 200° C. or less. In the case where polyethylene terephthalate is used as the support, the drying is preferably performed at a temperature of 80 to 150° C.

If the amount of the binder in the light-to-heat conversion layer is excessively small, the cohesion of the light-to-heat conversion layer decreases and at the time of transferring a formed image to an image-receiving sheet, the light-to-heat conversion layer is readily transferred together and this causes color mixing of the image, whereas if the amount of the polyimide resin is excessively large, the layer thickness of the light-to-heat conversion layer increases so as to achieve a constant light absorptivity and this readily incurs reduction in sensitivity. The mass ratio in the solid content between the light-to-heat converting substance and the binder of the light-to-heat conversion layer is preferably from 1:20 to 2:1, more preferably from 1:10 to 2:1.

As described above, reduction in the thickness of the light-to-heat conversion is preferred because the sensitivity of the thermal transfer sheet can be elevated.

The thickness of the light-to-heat conversion layer is preferably from 0.03 to 1.0 μm, more preferably from 0.05 to 0.5 μm. Furthermore, the light-to-heat conversion layer preferably has an optical density of 0.80 to 1.26 for light at a wavelength of 808 nm, because the image-forming layer is improved in the transfer sensitivity. The optical density for light at the above-described wavelength is more preferably from 0.92 to 1.15. If the optical density at the laser peak wavelength is less than 0.80, the irradiated light is insufficiently converted into heat and the transfer sensitivity decreases in some cases. On the other hand, if the optical density exceeds 1.26, this affects the function of the light-to-heat conversion layer on recording and fogging may be generated.

In the present invention, the optical density of the light-to-heat conversion layer in the thermal transfer sheet means absorptivity of the light-to-heat conversion layer at the peak wavelength of laser light used on performing the recording of the image forming material of the present invention. The optical density can be measured using a known spectrophotometer. In the present invention, UV-spectrophotometer UV-240 manufactured by Shimadzu Corporation is used. The optical density is a value obtained by subtracting the value of the support alone from the value of the light-to-heat conversion layer including the support.

(Image-Forming Layer)

The image-forming layer contains at least a pigment which is transferred to an image-receiving sheet and forms an image, and further contains a binder for forming the layer and if desired, other components.

The pigment in general is roughly classified into an organic pigment and an inorganic pigment. These are appropriately selected according to the use end by taking account of their properties, that is, the former provides a coating film having high transparency and the latter generally exhibits excellent masking property. In the case where the thermal transfer sheet is used for color proofing before printing, an organic pigment having a color agreeing with or close to yellow, magenta, cyan or black generally used in the printing ink is used. Other than these, a metal powder, a fluorescent pigment or the like is used in some cases. Examples of the pigment which is suitably used include azo-type pigments, phthalocyanine-type pigments, anthraquinone-type pigments, dioxazine-type pigments, quinacridone-type pigments, isoindolinone-type pigments and nitro-type pigments. The pigments for use in the image-forming layer are described below by classifying these using the color hue, however, the present invention is not limited thereto.

1) Yellow Pigment

Pigment Yellow 12 (C.I. No. 21090):

Permanent Yellow DEG (produced by Clariant Japan), Lionol Yellow 1212B (produced by Toyo Ink Mfg. Co., Ltd.), Irgalite Yellow LCT (produced by Ciba Specialty Chemicals), Symuler Fast Yellow GTF 219 (produced by Dainippon Ink & Chemicals Inc.)

Pigment Yellow 13 (C.I. No. 21100):

Permanent Yellow GR (produced by Clariant Japan), Lionol Yellow 1313 (produced by Toyo Ink Mfg. Co., Ltd.)

Pigment Yellow 14 (C.I. No. 21095):

Permanent Yellow G (produced by Clariant Japan), Lionol Yellow 1401-G (produced by Toyo Ink Mfg. Co., Ltd.), Seika Fast Yellow 2270 (produced by Dainichiseika Color & Chemicals Mfg. Co., Ltd.), Symuler Fast Yellow 4400 (produced by Dainippon Ink & Chemicals Inc.)

Pigment Yellow 17 (C.I. No. 21105):

Permanent Yellow GG02 (produced by Clariant Japan), Symuler Fast Yellow 8GF (produced by Dainippon Ink & Chemicals Inc.)

Pigment Yellow 155:

Graphtol Yellow 3GP (produced by Clariant Japan)

Pigment Yellow 180 (C.I. No. 21290):

Novoperm Yellow P-HG (produced by Clariant Japan), PV Fast Yellow HG (produced by Clariant Japan)

Pigment Yellow 139 (C.I. No. 56298):

Novoperm Yellow M2R 70 (produced by Clariant Japan)

2) Magenta Pigment

Pigment Red 57:1 (C.I. No. 15850:1):

Graphtol Rubine L6B (produced by Clariant Japan), Lionol Red 6B-4290G (produced by Toyo Ink Mfg. Co., Ltd.), Irgalite Rubine 4BL (produced by Ciba Specialty Chemicals), Symuler Brilliant Carmine 6B-229 (produced by Dainippon Ink & Chemicals Inc.)

Pigment Red 122 (C.I. No. 73915):

Hosterperm Pink E (produced by Clariant Japan), Lionogen Magenta 5790 (produced by Toyo Ink Mfg. Co., Ltd.), Fastogen Super Magenta RH (produced by Dainippon Ink & Chemicals Inc.)

Pigment Red 53:1 (C.I. No. 15585:1):

Permanent Lake Red LCY (produced by Clariant Japan), Symuler Lake Red C conc (produced by Dainippon Ink & Chemicals Inc.)

Pigment Red 48:1 (C.I. No. 15865:1):

Lionol Red 2B 3300 (produced by Toyo Ink Mfg. Co., Ltd.), Symuler Red NRY (produced by Dainippon Ink & Chemicals Inc.)

Pigment Red 48:2 (C.I. No. 15865:2):

Permanent Red W2T (produced by Clariant Japan), Lionol Red LX235 (produced by Toyo Ink Mfg. Co., Ltd.), Symuler Red 3012 (produced by Dainippon Ink & Chemicals Inc.)

Pigment Red 48:3 (C.I. No. 15865:3):

Permanent Red 3RL (produced by Clariant Japan), Symuler Red 2BS (produced by Dainippon Ink & Chemicals Inc.)

Pigment Red 177 (C.I. No. 65300):

Cromophtal Red A2B (produced by Ciba Specialty Chemicals)

3) Cyan Pigment:

Pigment Blue 15 (C.I. No. 74160):

Lionol Blue 7027 (produced by Toyo Ink Mfg. Co., Ltd.), Fastogen Blue BB (produced by Dainippon Ink & Chemicals Inc.)

Pigment Blue 15:1 (C.I. No. 74160):

Hosterperm Blue A2R (produced by Clariant Japan), Fastogen Blue 5050 (produced by Dainippon Ink & Chemicals Inc.)

Pigment Blue 15:2 (C.I. No. 74160):

Hosterperm Blue AFL (produced by Clariant Japan), Irgalite Blue BSP (produced by Ciba Specialty Chemicals), Fastogen Blue GP (produced by Dainippon Ink & Chemicals Inc.)

Pigment Blue 15:3 (C.I. No. 74160):

Hosterperm Blue B2G (produced by Clariant Japan), Lionol Blue FG7330 (produced by Toyo Ink Mfg. Co., Ltd.), Cromophtal Blue 4GNP (produced by Ciba Specialty Chemicals), Fastogen Blue FGF (produced by Dainippon Ink & Chemicals Inc.)

Pigment Blue 15:4 (C.I. No. 74160):

Hosterperm Blue BFL (produced by Clariant Japan), Cyanine Blue 700-10FG (produced by Toyo Ink Mfg. Co., Ltd.), Irgalite Blue GLNF (produced by Ciba Specialty Chemicals), Fastogen Blue FGS (produced by Dainippon Ink & Chemicals Inc.)

Pigment Blue 15:6 (C.I. No. 74160):

Lionol Blue ES (produced by Toyo Ink Mfg. Co., Ltd.)

Pigment Blue 60 (C.I. No. 69800):

Hosterperm Blue RL10 (produced by Clariant Japan), Lionogen Blue 6501 (produced by Toyo Ink Mfg. Co., Ltd.)

4) Black Pigment

Pigment Black 7 (Carbon Black C.I. No. 77266):

Mitsubishi Carbon Black MA100 (produced by Mitsubishi Chemical), Mitsubishi Carbon Black #5 (produced by Mitsubishi Chemical), Black Pearls 430 (produced by Cabot Co.)

The pigment which can be used in the present invention may be appropriately selected from commercially available products by referring to, for example, *Ganryo Binran* (*Handbook of Pigments*), compiled by Nippon Ganryo Gijutsu Kyokai, Seibundo Shinkosha (1989), and *Color Index*, The Society of Dyes & Colorist, 3rd ed. (1987).

The average particle size of the pigment is preferably from 0.03 to 1 μm, more preferably from. 0.05 to 0.5 μm.

If the particle size is less than 0.03 μm, the dispersion cost may increase or the dispersion solution may be gelled, whereas if the particle size exceeds 1 μm, the coarse pigment particle may inhibit the adhesion between the image-forming layer and the image-receiving layer or may inhibit the transparency of the image-forming layer.

The binder for the image-forming layer is preferably an amorphous organic high-molecular polymer having a softening point of 40 to 150° C. Examples of the amorphous organic high-molecular polymer include butyral resin, polyamide resin, polyethyleneimine resin, sulfonamide resin, polyester polyol resin, petroleum resin, homopolymers and copolymers of styrene or a derivative or substitution product thereof (e.g., styrene, vinyl toluene, α-methylstyrene, 2-methylstyrene, chlorostyrene, vinylbenzoic acid, sodium vinylbenzenesulfonate, aminostyrene), and homopolymers and copolymers with another monomer of a vinyl-base monomer such as methacrylic acid esters (e.g., methyl methacrylate, ethyl methacrylate, butyl methacrylate, hydroxyethyl methacrylate), methacrylic acid, acrylic acid esters (e.g., methyl acrylate, ethyl acrylate, butyl acrylate, α-ethylhexyl acrylate), acrylic acid, dienes (e.g., butadiene, isoprene), acrylonitrile, vinyl ethers, maleic acid, maleic acid esters, maleic anhydride, cinnamic acid, vinyl chloride and vinyl acetate. These resins may be used in combination of two or more thereof.

The image-forming layer preferably contains the pigment in an amount of 30 to 70 mass %, more preferably from 30 to 50 mass %. Also, the image-forming layer preferably contains the resin in an amount of 70 to 30 mass %, more preferably from 70 to 40 mass %.

The image-forming layer may contain the following components (1) to (3) as other components.

(1) Waxes

The waxes include mineral waxes, natural waxes and synthetic waxes. Examples of the mineral wax include petroleum wax (e.g., paraffin wax, microcrystalline wax, ester wax, oxidized wax), montan wax, ozokerite and ceresine. Among these, paraffin wax is preferred. The paraffin wax is separated from petroleum and various products differing in the melting point are available on the market.

Examples of the natural wax include plant waxes such as carnauba wax, Japan wax, ouricury wax and espal wax, and animal waxes such as beeswax, insect wax, shellac wax and spermaceti wax.

The synthetic wax is generally used as a lubricant and usually comprises a higher fatty acid-base compound. Examples of the synthetic wax include the followings.

1) Fatty Acid Wax

Linear saturated fatty acids represented by the following formula:

$$CH_3(CH_2)_nCOOH$$

wherein n represents an integer of 6 to 28. Specific examples thereof include a stearic acid, a behenic acid, a palmitic acid, a 12-hydroxystearic acid and an azelaic acid.

In addition, metal salts (e.g., K, Ca, Zn, Mg) of the above-described fatty acids can be used.

2) Fatty Acid Ester Wax

Specific examples of the ester of the above-described fatty acids include ethyl stearate, lauryl stearate, ethyl behenate, hexyl behenate and behenyl myristate.

3) Fatty Acid Amide Wax

Specific examples of the amide of the above-described fatty acids include stearic acid amide and lauric acid amide.

4) Aliphatic Alcohol Wax

Linear saturated aliphatic alcohols represented by the following formula:

$$CH_3(CH_2)_nOH$$

wherein n represents an integer of 6 to 28. Specific examples thereof include stearyl alcohol.

Among these synthetic waxes 1) to 4), higher fatty acid amides such as stearic acid amide and lauric acid amide are preferred. The above-described wax compounds may be used, if desired, individually or in appropriate combination.

(2) Plasticizer

The plasticizer is preferably an ester compound and examples thereof include known plasticizers such as phthalic acid esters, e.g., dibutyl phthalate, di-n-octyl phthalate, di(2-ethylhexyl) phthalate, dinonyl phthalate, dilauryl phthalate, butyllauryl phthalate, butylbenzyl phthalate; aliphatic dibasic acid esters, e.g., di(2-ethylhexyl) adipate, di(2-ethylhexyl) sebacate; phosphoric acid triesters, e.g., tricresyl phosphate, tri(2-ethylhexyl) phosphate; polyol polyesters, e.g., polyethylene glycol ester; and epoxy compounds, e.g., epoxy fatty acid ester. Among these, esters of vinyl monomer, particularly esters of acrylic acid or methacrylic acid are preferred in view of effect brought about by the addition on the improvement in the transfer sensitivity or transfer unevenness and on the control of elongation to break.

Examples of the ester compound of acrylic acid or methacrylic acid include polyethylene glycol dimethacrylate, 1,2,4-butanetriol trimethacrylate, trimethylolethane triacrylate, pentaerythritol acrylate, pentaerythritol tetraacrylate and dipentaerythritol polyacrylate.

The plasticizer may be a polymer. In particular, polyester is preferred because of its great addition effect and difficult diffusibility under storage conditions. Examples of the polyester include sebacic acid-base polyester and adipic acid-base polyester.

The additives contained in the image-forming layer are not limited to those described above. Also, the plasticizers may be used individually or in combination of two or more thereof.

If the content of the above-described additives in the image-forming layer is excessively large, the resolution of transfer image may decrease, the film strength of the image-forming layer itself may decrease or an unexposed area may be transferred to the image-receiving sheet due to reduction in the adhesive strength between the light-to-heat conversion layer and the image-forming layer. In view of these points, the wax content is preferably from 0.1 to 30 mass %, more preferably from 1 to 20 mass %, based on the entire solid content in the image-forming layer. The plasticizer content is preferably from 0.1 to 20 mass %, more preferably from 0.1 to 10 mass %, based on the entire solid content in the image-forming layer.

(3) Others

In addition to the above-described components, the image-forming layer may contain a surfactant, an inorganic or organic fine particle (e.g., metal powder, silica gel), an oil (e.g., linseed oil, mineral oil), a thickener, an antistatic agent and the like. Except for the case of obtaining a black image, when a substance capable of absorbing light at the wavelength of the light source used for the image recording is incorporated, the energy necessary for the transfer can be reduced. The substance capable of absorbing light at the wavelength of the light source may be either a pigment or a dye, however, in the case of obtaining a color image, use of an infrared light source such as semiconductor laser for the image recording and use of a dye having small absorption in the visible region but large absorption at the wavelength of the light source are preferred in view of the color reproduction. Examples of the near infrared dye include the compounds described in JP-A-3-103476.

The image-forming layer can be provided by preparing a coating solution having dissolved or dispersed therein the pigment, the binder and the like, applying the coating solution onto a light-to-heat conversion layer (when a heat-sensitive release layer which is described later is provided on the light-to-heat conversion layer, onto the heat-sensitive release layer), and drying the solution. Examples of the solvent used for the preparation of the coating solution include n-propyl alcohol, methyl ethyl ketone, propylene glycol monomethyl ether (MFG), methanol and water. The coating and drying can be performed using ordinary coating and drying methods.

On the light-to-heat conversion layer of the thermal transfer sheet, a heat-sensitive release layer containing a heat-sensitive material which generates a gas or releases adhered water or the like under the action of heat generated from the light-to-heat conversion layer and thereby weakens the bonding strength between the light-to-heat conversion layer and the image-forming layer, may be provided. As the heat-sensitive material, a compound (a polymer or a low molecular compound) capable of decomposing or denaturing by itself due to heat and generating a gas, a compound (a polymer or a low molecular compound) having absorbed or adsorbed therein a fairly large amount of an easily vaporizable gas such as moisture, or the like may be used. These may be used in combination.

Examples of the polymer capable of decomposing or denaturing due to heat and generating a gas include self-oxidizing polymers such as nitrocellulose; halogen-containing polymers such as chlorinated polyolefin, chlorinated rubber, polychlorinated rubber, polyvinyl chloride and polyvinylidene chloride; acrylic polymers such as polyisobutyl methacrylate having adsorbed therein a volatile compound (e.g., moisture); cellulose esters such as ethyl cellulose having adsorbed therein a volatile compound (e.g., moisture); and natural polymer compounds such as gelatin having adsorbed therein a volatile compound (e.g., moisture). Examples of the low molecular compound capable of decomposing or denaturing due to heat and generating a gas include a compound which undergoes an exothermic decomposition and thereby generates a gas, such as diazo compound and azide compound.

The decomposition or denaturing of the heat-sensitive material due to heat preferably occurs at 280° C. or less, more preferably 230° C. or less.

In the case where a low molecular compound is used as the heat-sensitive material of the heat-sensitive release layer, the compound is preferably combined with a binder. The binder used here may be the above-described polymer capable of decomposing or denaturing by itself due to heat and generating a gas, or may be an ordinary binder lacking in such property. When the heat-sensitive low molecular compound is used in combination with a binder, the mass ratio of the former to the latter is preferably from 0.02:1 to 3:1, more preferably from 0.05:1 to 2:1. The heat-sensitive release layer preferably covers almost the entire surface of the light-to-heat conversion layer. The thickness thereof is generally from 0.03 to 1 μm, preferably from 0.05 to 0.5 μm.

In the case of a thermal transfer sheet having a constitution such that a light-to-heat conversion layer, a heat-sensitive release layer and an image-forming layer are stacked in this order on a support, the heat-sensitive release layer undergoes decomposition or denaturing due to heat transmitted from the light-to-heat conversion layer and generates a gas. By this decomposition or generation of gas, the heat-sensitive release layer is partially lost or a cohesive failure takes place within the heat-sensitive release layer, as a result, the bonding strength between the light-to-heat conversion layer and the image-forming layer decreases. Accordingly, depending on the behavior of the heat-sensitive release layer, a part of the heat-sensitive release layer may adhere to the image-forming layer and appear on the finally formed image, giving rise to color mixing of the image. Because of this, in order to ensure that color mixing is not visually perceived in the formed image even if the above-described transfer of the heat-sensitive release layer takes place, the heat-sensitive release layer is preferably almost colorless, that is, highly transmissive to visible light. Specifically, the light absorption coefficient of the heat-sensitive release layer is, for visible light, 50% or less, preferably 10% or less.

The thermal transfer sheet may also have a constitution such that in place of independently providing a heat-sensitive release layer, the above-described heat-sensitive material is added to the coating solution for the light-to-heat conversion layer and the formed light-to-heat conversion layer serves as a light-to-heat conversion layer and as a heat-sensitive release layer at the same time.

The outermost layer of the thermal transfer sheet in the side where the image-forming layer is provided preferably has a static friction coefficient of 0.35 or less, more preferably 0.20 or less. When the outermost layer is rendered to have a static friction coefficient of 0.35 or less, the thermal transfer sheet under transportation can be prevented from contamination with roll and the formed image can have high image quality. The coefficient of static friction is measured according to the method described in Japanese Patent Application No. 2000-85759, paragraph (0011).

The Smooster value on the surface of the image-forming layer is preferably from 0.5 to 50 mmHg (about 0.0665 to 6.65 kPa) at 23° C. and 55% RH and at the same time, the Ra value is preferably from 0.05 to 0.4 μm. With these values, a large number of microscopic voids formed on the contact surface to inhibit the contacting between the image-receiving layer and the image-forming layer can be reduced and this is advantageous in view of transfer and in turn image quality. The Ra value can be measured according to JIS B0601 using a surface roughness meter (Surfcom, manufactured by Tokyo Seimitsu Co., Ltd.). The surface hardness of the image-forming layer is preferably 10 g or more with a sapphire needle. One second after the earth connection of the thermal transfer sheet which is electrified according to Federal Test Standard 4046, the charge potential of the image-forming layer is preferably from −100 to 100 V. The surface resistance of the image-forming layer is preferably $10^9$ Ω or less at 23° C. and 55% RH.

The image-receiving sheet which is used in combination with the above-described thermal transfer sheet is described below. E[Image-Receiving Sheet]

(Layer Constitution)

The image-receiving sheet usually has a constitution such that one or more image-receiving layer is provided on a support and if desired, one or more of a cushion layer, a release layer and an interlayer is provided between the support and the image-receiving layer. In view of the transportation, the image-receiving sheet preferably has a back layer on the surface of the support in the side opposite the image-receiving layer.

In the present invention, the above-described fluorine-containing surfactant, namely, the copolymer (I) may be blended in the image-receiving layer. This is described in detail above.

(Support)

Examples of the support include normal sheet-form substrates such as plastic sheet, metal sheet, glass sheet, resin coated paper, paper and various composite materials. Examples of the plastic sheet include polyethylene terephthalate sheet, polycarbonate sheet, polyethylene sheet, polyvinyl chloride sheet, polyvinylidene chloride sheet, polystyrene sheet, styrene-acrylonitrile sheet and polyester sheet. Examples of the paper which can be used include printing paper and coated paper.

The support preferably has fine voids, because the image quality can be improved. Such a support can be manufactured as follows. For example, a thermoplastic resin and a filler comprising an inorganic pigment, a polymer incompatible with the thermoplastic resin or the like are mixed, the obtained mixture melt is formed into a single-layer or multi-layer film using a melt extruder and the resulting film is uniaxially or biaxially stretched. In this case, the void percentage is determined by the resin and filler selected, the mixing ratio, the stretching conditions and the like.

As the above-described thermoplastic resin, polyolefin resins such as polypropylene, and polyethylene terephthalate resins are preferred because of their high crystallinity, good stretching property and easiness in the formation of voids. It is preferred to use the polyolefin resin or polyethylene terephthalate resin as the main component and appropriately use a small amount of another thermoplastic resin in combination. The inorganic pigment used as the filler preferably has an average particle size of 1 to 20 $\mu$m and examples of the inorganic pigment which can be used include calcium carbonate, clay, kieselguhr, titanium oxide, aluminum hydroxide and silica. As for the incompatible resin used as the filler, in the case where polypropylene is used as the thermoplastic resin, polyethylene terephthalate is preferably used in combination as the filler. The support having fine voids is described in detail in Japanese Patent Application No. 11-290570.

In the support, the content of the filler such as inorganic pigment is generally on the order of 2 to 30% by volume.

In the image-receiving sheet, the thickness of the support is usually from 10 to 400 $\mu$m, preferably from 25 to 200 $\mu$m. The surface of the support may be subjected to a surface treatment such as corona discharge treatment or glow discharge treatment so as to elevate the adhesive property with the image-receiving layer (or cushion layer) or the adhesive property with the image-forming layer of the thermal transfer sheet.

(Image-Receiving Layer)

Since the image-forming layer is transferred and fixed on the surface of the image-receiving sheet, one or more image-receiving layer is preferably provided on the support. The image-receiving layer is preferably formed of mainly an organic polymer binder. This binder is preferably a thermoplastic resin and examples thereof include homopolymers and copolymers of acrylic monomers such as acrylic acid, methacrylic acid, acrylic acid ester and methacrylic acid ester; cellulose-base polymers such as methyl cellulose, ethyl cellulose and cellulose acetate; homopolymers and copolymers of vinyl-base monomers, such as polystyrene, polyvinylpyrrolidone, polyvinyl butyral, polyvinyl alcohol, polyvinyl chloride, half-esterified styrene-maleic acid copolymer, half-esterified styrene-fumaric acid copolymer and esterified styrene-acrylic acid copolymer; condensed polymers such as polyester and polyamide; and rubber-base polymers such as butadiene-styrene copolymer.

Among these, at least one polymer selected from polyvinyl butyral, a half-esterified styrene-maleic acid copolymer, a half-esterified styrene-fumaric acid copolymer and an esterified styrene-acrylic acid copolymer is preferably used as the polymer binder.

For obtaining an appropriate adhesive strength with the image-forming layer, the binder of the image-receiving layer is preferably a polymer having a glass transition temperature (Tg) of less than 90° C. For this purpose, a plasticizer may also be added to the image-receiving layer. Furthermore, the binder polymer preferably has a Tg of 30° C. or more so as to prevent blocking between sheets. In particular, from the standpoint of improving the adhesive property with the image-forming layer at the laser recording and elevating the sensitivity or image strength, the binder polymer of the image-receiving layer is preferably the same as or analogous to the binder polymer of the image-forming layer.

It is preferred that the Smooster value on the image-receiving layer surface is from 0.5 to 50 mmHg (about 0.0665 to 6.65 kPa) at 23° C. and 55% RH and at the same time, the Ra value is from 0.05 to 0.4 $\mu$m. With these values, a large number of microscopic voids formed on the contact face to inhibit the contacting between the image-receiving layer and the image-forming layer can be reduced and this is advantageous in view of transfer and in turn image quality. The Ra value can be measured according to JIS B0601 using a surface roughness meter (Surfcom, manufactured by Tokyo Seimitsu Co., Ltd.). One second after the earth connection of the image-receiving sheet which is electrified according to Federal Test Standard 4046, the charge potential of the image-receiving layer is preferably from −100 to 100 V. The surface resistance of the image-receiving layer is preferably $10^9$ Ω or less at 23° C. and 55% RH. The coefficient of static friction is preferably 0.8 or less on the surface of the image-receiving layer and the surface energy on the surface of the image-receiving layer is preferably from 23 to 35 mJ/$m^2$.

In the case of once forming an image on the image-receiving layer and re-transferring the image to printing paper or the like, at least one image-receiving layer is preferably formed of a photocurable material. Examples of the composition for the photocurable material include a combination of a) a photopolymerizable monomer comprising at least one polyfunctional vinyl or vinylidene compound capable of forming a photopolymer by the addition polymerization, b) an organic polymer, c) a photopolymerization initiator and if desired, additives such as thermopolymerization inhibitor. For the polyfunctional vinyl monomer, an unsaturated ester of polyol, particularly an ester of acrylic acid or methacrylic acid, such as ethylene glycol diacrylate and pentaerythritol tetraacrylate, is used.

Examples of the organic polymer include polymers described above as the polymer for the formation of the image-receiving layer. As for the photopolymerization initiator, a normal photoradical polymerization initiator such as benzophenone or Michler's ketone is used in a proportion of 0.1 to 20 mass % in the layer.

The thickness of the image-receiving layer is from 0.3 to 7 μm, preferably from 0.7 to 4 μm. If the thickness is less than 0.3 μm, the film strength is insufficient and the layer is readily ruptured at the re-transfer to printing paper. If the thickness is too large, the gloss of image after the re-transfer to printing paper increases and the approximation to a printed matter decreases.

(Other Layers)

A cushion layer is preferably provided between the support and the image-receiving layer. When a cushion layer is provided, the adhesive property between the image-forming layer and the image-receiving layer is improved at the thermal transfer using a laser and the image quality can be improved. Furthermore, even if foreign matters are mingled between the thermal transfer sheet and the image-receiving sheet at the recording, voids between the image-receiving layer and the image-forming layer are reduced in the size due to deformation activity of the cushion layer, as a result, the size of image defects such as white spot can also be made small. In addition, when an image is formed by the transfer and this image is transferred to separately prepared printing paper or the like, the image-receiving surface deforms according to the irregularities on the paper surface and therefore, the transferability of the image-receiving layer can be improved. Also, the gloss of the material to be transferred decreases, whereby the approximation to a printed matter can be improved.

The cushion layer is constituted to readily deform upon application of a stress onto the image-forming layer and for achieving the above-described effect, this layer is preferably formed of a material having a low modulus of elasticity, a material having rubber elasticity or a thermoplastic resin which is easily softened by heat. The elastic modulus of the cushion layer is preferably from 0.5 MPa to 1.0 GPa, more preferably from 1 MPa to 0.5 GPa, still more preferably from 10 to 100 MPa, at room temperature. Also, for burying foreign matters such as dust, the penetration (25° C., 100 g, 5 seconds) prescribed by JIS K2530 is preferably 10 or more. The glass transition temperature of the cushion layer is 80° C. or less, preferably 25° C. or less, and the softening point is preferably from 50 to 200° C. For adjusting these physical properties, for example, Tg, a plasticizer may be suitably added into the binder.

Specific examples of the material used as the binder of the cushion layer include polyethylene, polypropylene, polyester, styrene-butadiene copolymers, ethylene-vinyl acetate copolymers, ethylene-acryl copolymers, vinyl chloride-vinyl acetate copolymers, vinylidene chloride resin, plasticizer-containing vinyl chloride resin, polyamide resin and phenol resin, in addition to rubbers such as urethane rubber, butadiene rubber, nitrile rubber, acryl rubber and natural rubber.

The thickness of the cushion layer varies depending on the resin used and other conditions but is usually from 3 to 100 μm, preferably from 10 to 52 μm.

The image-receiving layer and the cushion layer must be bonded until the laser recording stage but for transferring the image to printing paper, these layers are preferably provided in the releasable state. In order to facilitate the release, a release layer having a thickness of approximately from 0.1 to 2 μm is preferably provided between the cushion layer and the image-receiving layer. If the film thickness is excessively large, the performance of the cushion layer cannot be easily brought out. Therefore, the film thickness must be adjusted depending on the kind of the release layer.

Specific examples of the binder of the release layer include polyolefin, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resin, fluorine-containing resin, styrenes such as polystyrene and acrylonitrile styrene, crosslinked products of these resins, thermosetting resins having a Tg of 65° C. or more, such as polyamide, polyimide, polyether imide, polysulfone, polyether sulfone and aramid, and cured products of these resins. The curing agent used here can be a general curing agent such as isocyanate and melamine.

On considering the above-described properties in the selection of the binder of the release layer, polycarbonate, acetal and ethyl cellulose are preferred in view of storability, and these are particularly preferred when an acrylic resin is used in the image-receiving layer, because good releasability can be obtained at the retransfer of the image after the thermal transfer using a laser.

Also, a layer which is extremely reduced in the adhesive property with the image-receiving layer on cooling may be used as the release layer. Specifically, a layer mainly comprising a heat-fusible compound such as wax or binder, or a thermoplastic resin may be used.

Examples of the heat-fusible compound include the substances described in JP-A-63-193886. In particular, microcrystalline wax, paraffin wax and carnauba wax are preferred. Preferred examples of the thermoplastic resin include ethylene-base copolymers (e.g., ethylene-vinyl acetate resin) and cellulose-base resins.

In such a release layer, additives such as higher fatty acid, higher alcohol, higher fatty acid ester, amides and higher amine may be added, if desired.

In another constitution of the release layer, a layer which is fused or softened on heating and. undertakes cohesive failure by itself, thereby exhibiting releasability, may be used. This release layer preferably contains a supercooling substance.

Examples of the supercooling substance include poly-ε-caprolactone, polyoxyethylene, benzotriazole, tribenzyl amine and vanillin.

In still another constitution of the release layer, a compound capable of reducing the adhesive property with the image-receiving layer is incorporated. Examples of this compound include silicone-base resins such as silicone oil; fluorine-containing resins such as Teflon and fluorine-containing acrylic resin; polysiloxane resin; acetal-base resins such as polyvinyl butyral, polyvinyl acetal and polyvinyl formal; solid waxes such as polyethylene wax and amide wax; and fluorine- or phosphoric acid ester-containing surfactants.

The release layer can be formed by a method where the above-described raw materials are dissolved or dispersed like a latex in a solvent and the solution or dispersion is coated on the cushion layer using a coating method such as blade coater, roll coater, bar coater, curtain coater or gravure coater or using an extrusion lamination method by hot melting. The release layer can also be formed by a method where the raw materials are dissolved or dispersed like a latex in a solvent, the solution and dispersion is coated on a temporary base using the above-described method, the obtained coating is attached to the cushion layer, and the temporary base is peeled off.

The image-receiving sheet combined with the thermal transfer sheet may have a constitution such that the image-receiving layer serves also as the cushion layer. In this case, the image-receiving sheet may have a structure of support/cushiony image-receiving layer or a structure of support/undercoat layer/cushiony image-receiving layer. Also in this case, the cushiony image-receiving layer is preferably provided in the releasable state so as to enable the retransfer onto printing paper. If the case is so, the image after the retransfer onto printing paper can be an image having excellent glossiness.

The thickness of the cushiony image-receiving layer is from 5 to 100 μm, preferably from 10 to 40 μm.

In the image-receiving sheet, a back layer is preferably provided on the surface of the support in the side opposite the surface where the image-receiving layer is provided, because the image-receiving sheet can be improved in the transportation property. For the purpose of attaining good transportation within the recording device, the back layer preferably contains an antistatic agent such as surfactant or tin oxide fine particle, and a matting agent such as silicon oxide or PMMA particle.

These additives can be added not only to the back layer but also, if desired, to the image-receiving layer or other layers. The kind of the additive varies depending on the purpose and cannot be indiscriminately specified, however, for example, in the case of a matting agent, particles having an average particle size of 0.5 to 10 μm may be added to the layer in a proportion of approximately from 0.5 to 80%.

The antistatic agent may be appropriately selected from various surfactants and electrically conducting agents and used such that the surface resistance of the layer is $10^{12}$ Ω or less, preferably $10^{9}$ Ω or less, under the conditions of 23° C. and 50% RH.

For the binder used in the back layer, a general-purpose polymer may be used, such as gelatin, polyvinyl alcohol, methyl cellulose, nitrocellulose, acetyl cellulose, aromatic polyamide resin, silicone resin, epoxy resin, alkyd resin, phenol resin, melamine resin, fluororesin, polyimide resin, urethane resin, acrylic resin, urethane-modified silicone resin, polyethylene resin, polypropylene resin, polyester resin, Teflon resin, polyvinyl butyral resin, vinyl chloride-base resin, polyvinyl acetate, polycarbonate, organic boron compound, aromatic esters, fluorinated polyurethane and polyether sulfone.

When a crosslinkable water-soluble binder is used as the binder of the back layer, this is effective in preventing the matting agent from powder falling or improving the scratch resistance of the back layer. The use of this binder also provides a great effect on the blocking during storage.

As for the crosslinking means, any one of heat, active ray and pressure or a combination thereof may be used without any particular limitation according to the properties of the crosslinking agent used. Depending on the case, an arbitrary adhesive layer may be provided on the support in the side where the back layer is provided, so that adhesive property to the support can be imparted.

For the matting agent which is preferably added to the back layer, an organic or inorganic fine particle can be used. Examples of the organic matting agent include a fine particle of radical polymerization-type polymer such as polymethyl methacrylate (PMMA), polystyrene, polyethylene and polypropylene, and a fine particle of condensed polymer such as polyester and polycarbonate.

The back layer is preferably provided in a coated amount of approximately from 0.5 to 5 g/m$^2$. If the coated amount is less than 0.5 g/m$^2$, the coating property is unstable and problems such as powder falling of the matting agent are readily caused, whereas if it exceeds 5 g/m$^2$, the particle size of the suitable matting agent becomes very large and the image-receiving layer surface is embossed by the back layer during storage, as a result, missing or uneven formation of a recorded image readily occurs particularly in the thermal transfer of transferring a thin-film image-forming layer.

The matting agent preferably has a number average particle size 2.5 to 20 μm larger than the film thickness of the back layer comprising only a binder. In the matting agent, particles having a particle size of 8 μm or more must be present in an amount of 5 mg/m$^2$ or more, preferably from 6 to 600 mg/m$^2$. By containing the matting agent as such, the foreign matter failure can be improved. Also, by using a matting agent having a narrow particle size distribution such that the value (σ/rn (=coefficient of variation in the particle size distribution)) obtained by dividing the standard deviation of the particle size distribution by the number average particle size is 0.3 or less, the defect generated due to particles having an extraordinarily large particle size can be improved and moreover, a desired performance can be obtained by the addition in a smaller amount. This coefficient of variation is preferably 0.15 or less.

In the back layer, an antistatic agent is preferably added so as to prevent adhesion of foreign matters due to frictional electrification with a transportation roll. Examples of the antistatic agent which can be used include cationic surfactants, anionic surfactants, nonionic surfactants, polymer antistatic agents, electrically conducting fine particles and compounds over a wide range described in 11290 *no Kagaku Shohin* (11290 *Chemical Products*), Kagaku Kogyo Nippo Sha, pp. 875–876.

Among these substances as the antistatic agent which can be used in combination in the back layer, preferred are metal oxides such as carbon black, zinc oxide, titanium oxide and tin oxide, and electrically conducting fine particles such as organic semiconductor. In particular, electrically conducting fine particle is preferred, because the antistatic agent does not dissociate from the back layer and the antistatic effect can be stably obtained independently of the environment.

In the back layer, various activators or release agents such as silicone oil and fluororesin may also be added so as to impart coatability or releasability.

The back layer is particularly preferred when the cushion layer and the image-receiving layer each has a softening point of 70° C. or less as measured by TMA (thermomechanical analysis).

The TMA softening point is determined by elevating the temperature of an object to be measured at a constant temperature-rising rate while applying a constant load, and observing the phase of the object. In the present invention, the temperature where the phase of the object to be measured starts changing is defined as the TMA softening point. The measurement of the softening point by TMA can be performed using an apparatus such as Thermoflex manufactured by Rigaku Denki Sha.

In the image formation, the thermal transfer sheet and the image-receiving sheet can be used as a laminate obtained by superposing the image-forming layer of the thermal transfer sheet on the image-receiving layer of the image-receiving sheet.

The laminate of the thermal transfer sheet and the image-receiving sheet can be formed by various methods. For example, the laminate can be easily obtained by superposing the image-forming layer of the thermal transfer sheet on the image-receiving layer of the image-receiving sheet and passing these sheets between pressure and heating rollers. In this case, the heating temperature is preferably 160° C. or less, or 130° C. or less.

Another suitable method for obtaining the laminate is the above-described vacuum contact method. In the vacuum contact method, an image-receiving sheet is first wound around a drum having provided thereon suction holes for vacuumization and then, a thermal transfer sheet having a slightly larger size than the image-receiving sheet is vacuum-contacted with the image-receiving sheet while uniformly expelling air by a squeeze roller. Other than this, a method where an image-receiving sheet is attached to a metal drum while mechanically pulling the image-receiving sheet and further thereon, a thermal transfer sheet is attached similarly while mechanically pulling the thermal transfer sheet, thereby contacting these sheets, may also be used. Among these methods, a vacuum contact method is preferred, because the temperature of heat roller and the like need not be controlled and the layers can be rapidly and uniformly stacked with ease.

EXAMPLES

The present invention is described in greater detail below by referring to Examples, however, the present invention should not be construed as being limited thereto. In the Examples, unless otherwise indicated, the "parts" means "parts by mass (weight)".

Examples 1 to 3 and Comparative Example 1

Manufacture of Thermal Transfer Sheet K (Black)

[Formation of Back Layer]

[Preparation of Coating Solution for Back First Layer]

| | |
|---|---|
| Water dispersion of acrylic resin ("JURIMER ET410", solid content: 20 mass %, Nippon Junyaku K.K.) | 2 parts |
| Antistatic agent (water dispersion of tin oxide-antimony oxide) (average particle size: 0.1 μm, 17 mass %) | 7.0 parts |
| Polyoxyethylene phenyl ether | 0.1 part |
| Melamine compound ("SUMITICS Resin M-3", produced by Sumitomo Chemical Co., Ltd.) | 0.3 parts |
| Distilled water to make a total of | 100 parts |

[Formation of Back First Layer]

One surface (back surface) of a 75 μm-thick biaxially stretched polyethylene terephthalate support (Ra is 0.01 μm on both surfaces) was subjected to a corona treatment and the coating solution for the back first layer was coated thereon to a dry thickness of 0.03 μm and dried at 180° C. for 30 seconds to form a back first layer. The Young's modulus in the longitudinal direction of the support was 450 kg/mm$^2$ (=about 4.4 GPa) and the Young's modulus in the cross direction was 500 kg/mm$^2$ (=about 4.9 GPa). The F-5 value in the longitudinal direction of the support was 10 kg/mm$^2$ (=about 98 MPa) and the F-5 value in the cross direction of the support was 13 kg/mm$^2$ (=about 127.4 MPa). The heat shrinkage percentage of the support at 100° C. for 30 minutes was 0.3% in the longitudinal direction and 0.1% in the cross direction. The breaking strength was 20 kg/mm$^2$ (=about 196 MPa) in the longitudinal direction and 25 kg/mm$^2$ (=about 245 MPa) in the cross direction. The elastic modulus was 400 kg/mm$^2$ (=about 3.9 GPa).

[Preparation of Coating Solution for Back Second Layer]

| | |
|---|---|
| Polyolefin ("CHEMIPEARL S-120", 27 mass %, produced by Mitsui Petrochemical Industries, Ltd.) | 3.0 parts |
| Antistatic agent (water dispersion of tin oxide-antimony oxide) (average particle size: 0.1 μm, 17 mass %) | 2.0 parts |

-continued

| | |
|---|---|
| Colloidal silica ("SNOWTEX C", 20 mass %, produced by Nissan Chemicals Industries, Ltd.) | 2.0 parts |
| Epoxy compound ("DINACOL EX-614B", produced by Nagase Kasei K.K.) | 0.3 parts |
| Distilled water to make a total of | 100 parts |

[Formation of Back Second Layer]

The coating solution for the back second layer was coated on the back first layer to a dry thickness of 0.03 μm and then dried at 170° C. for 30 seconds to form a back second layer.

1) Preparation of Coating Solution for Light-to-heat Conversion Layer

The following components were mixed while stirring with a stirrer to prepare a coating solution for the light-to-heat conversion layer.

[Composition of Coating Solution for Light-to-heat Conversion Layer]

| | |
|---|---|
| Infrared light absorbing dye ("NK-2014", produced by Nippon Kanko Shikiso Co., Ltd., cyanine dye having a structure shown below) | 7.6 parts |

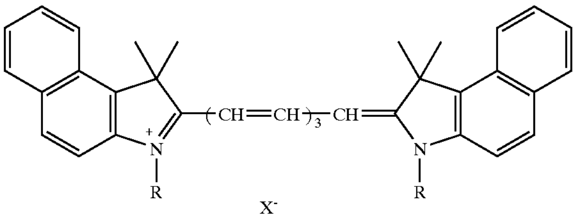

(wherein R represents $CH_3$ and $X^-$ represents $ClO_4^-$)

| | |
|---|---|
| Polyimide resin shown below ("RIKACOTE SN-20", produced by Shin Nippon Rika K.K., thermal decomposition temperature: 510° C.) | 29.3 parts |

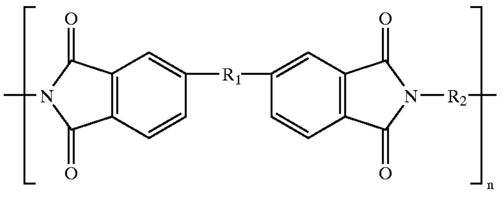

(wherein $R_1$ represents $SO_2$ and $R_2$ represents

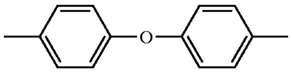

or

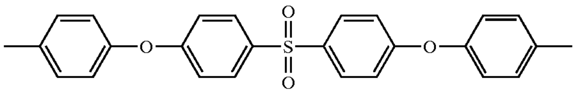

| | |
|---|---|
| Exxon Naphtha | 5.8 parts |
| N-Methylpyrrolidone (NMP) | 1,500 parts |
| Methyl ethyl ketone | 360 parts |
| Surfactant ("Megafac F-176PF", produced by Dainippon Ink & Chemicals Inc., F-containing surfactant) | 0.5 parts |
| Matting agent dispersion solution having the following composition | 14.1 parts |

-continued

| Matting agent dispersion solution: | |
|---|---|
| N-methyl-2-pyrrolidone (NMP) | 69 parts |
| Methyl ethyl ketone | 20 parts |
| Styrene acryl resin ("JONCRYL 611" produced by Johnson Polymer) | 3 parts |
| $SiO_2$ Particle ("SEAHOSTER KEP150", silica gel particle, produced by Nippon Shokubai K.K.) | 8 parts |

2) Formation of Light-to-Heat Conversion Layer on Support Surface

On one surface of the 75 μm-thick polyethylene terephthalate film (support), the coating solution for the light-to-heat conversion layer prepared above was coated using a wire bar and then, the coating was dried for 2 minutes in an oven at 120° C. to form a light-to-heat conversion layer on the support. The optical density of the obtained light-to-heat conversion layer at a wavelength of 808 nm was measured using a UV-spectrophotometer UV-240 manufactured by Shimadzu Corporation and found to be OD=1.03. The cross-section of the light-to-heat conversion layer was observed through a scanning electron microscope and the layer thickness was found to be 0.3 μm on average.

3) Preparation of Coating Solution for Black Image-Forming Layer

Respective components shown below were charged into a mill of a kneader and a dispersion pretreatment was performed by applying a shear force while adding a slight amount of a solvent. To the obtained dispersion, the solvent was further added to finally have the following composition, and the resulting solution was dispersed in a sand mill for 2 hours to obtain a pigment dispersion mother solution.

[Composition of Black Pigment Dispersion Mother Solution]

| | |
|---|---|
| Composition 1: | |
| Polyvinyl butyral ("Eslec B BL-SH", produced by Sekisui Chemical Co., Ltd.) | 12.6 parts |
| Pigment Black 7 (Carbon Black C.I. No. 77266) ("Mitsubishi Carbon Black #5", produced by Mitsubishi Chemical, PVC blackness: 1) | 4.5 parts |
| Dispersion aid ("SOLSPERSE S-20000", produced by ICI) | 0.8 parts |
| n-Propyl alcohol | 79.4 parts |
| Composition 2: | |
| Polyvinyl butyral ("Eslec B BL-SH", produced by Sekisui Chemical Co., Ltd.) | 12.6 parts |
| Pigment Black 7 (Carbon Black C.I. No. 77266) ("Mitsubishi Carbon Black MA-100", produced by Mitsubishi Chemical, PVC blackness: 10) | 10.5 parts |
| Dispersion aid ("SOLSPERSE S-20000", produced by ICI) | 0.8 parts |
| n-Propyl alcohol | 79.4 parts |

Then, the components shown below were mixed while stirring with a stirrer to prepare a coating solution for the black image-forming layer.

[Composition of Coating Solution for Black Image-Forming Layer]

| | |
|---|---|
| Black pigment dispersion mother solution prepared above [Composition 1:Composition 2 = 70:30 (by parts)] | 185.7 parts |
| Polyvinyl butyral ("Eslec B BL-SH", produced by Sekisui Chemical Co., Ltd.) | 11.9 parts |

-continued

| Wax-base compounds: | |
|---|---|
| (Stearic acid amide, "NEWTRON 2", produced by Nippon Seika) | 1.7 parts |
| (Behenic acid amide, "DIAMID BM", produced by Nippon Kasei) | 1.7 parts |
| (Lauric acid amide, "DIAMID Y", produced by Nippon Kasei) | 1.7 parts |
| (Palmitic acid amide, "DIAMID KP", produced by Nippon Kasei) | 1.7 parts |
| (Erucic acid amide, "DIAMID L-200", produced by Nippon Kasei) | 1.7 parts |
| (Oleic acid amide, "DIAMID O-200", produced by Nippon Kasei) | 1.7 parts |
| Rosin ("KE-311", produced by Arakawa Kagaku) (component: 80 to 97% of resin acid, resin acid components: 30 to 40% of abietic acid, 10 to 20% of neoabietic acid, 14% of dihydroabietic acid, 14% of tetrahydroabietic acid) | 11.4 parts |
| Fluorine-containing surfactant (copolymer shown in Table 1) | 1.5 parts |
| Inorganic pigment ("MEK-ST", 30% methyl ethyl ketone solution, produced by Nissan Chemicals Industries, Ltd.) | 7.1 parts |
| n-Propyl alcohol | 1,050 parts |
| Methyl ethyl ketone | 295 parts |

The particles in the thus-obtained coating solution for the black image-forming layer were measured by a particle size distribution meter employing a laser scattering system, as a result, the average particle size was 0.25 μm and particles of 1 μm or more occupied 0.5%.

4) Formation of Black Image-Forming Layer on Light-to-Heat Conversion Layer Surface On the surface of the light-to-heat conversion layer formed above, the coating solution for the black image-forming layer prepared above was coated using a wire bar for 1 minute and then, the coating was dried for 2 minutes in an oven at 100° C. to form a black image-forming layer on the light-to-heat conversion layer. In this way, a thermal transfer sheet where a light-to-heat conversion layer and a black image-forming layer were provided in this order on a support was prepared (hereinafter referred to as Thermal Transfer Sheet K; similarly, a thermal transfer sheet where a yellow image-forming layer was provided is referred to as Thermal Transfer Sheet Y, a thermal transfer sheet where a magenta image-forming layer was provided is referred to as Thermal Transfer Sheet M, and a thermal transfer sheet where a cyan image-forming layer was provided is referred to Thermal Transfer Sheet C). The optical density (optical density: OD) of the black image-forming layer of Thermal Transfer Sheet K was measured by a Macbeth densitometer "TD-904" (W filter) and found to be OD=0.91. Also, the thickness of the black image-forming layer was measured and found to be 0.60 μm on average. Furthermore, the thickness of the black image-forming layer was measured and found to be 0.60 μm on average.

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 9.3 mmHg (=about 1.24 kPa).

The coefficient of static friction on the surface, which is preferably 0.2 or less, was 0.08.

Manufacture of Thermal Transfer Sheet Y

Thermal Transfer Sheet Y was manufactured in the same manner as in the manufacture of Thermal Transfer Sheet K except for using a coating solution for yellow image-forming layer having a composition shown below in place of the coating solution for black image-forming layer in the manufacture of Thermal Transfer Sheet K. The image-forming layer of Thermal Transfer Sheet Y obtained had a layer thickness of 0.42 μm.

[Composition of Yellow Pigment Dispersion Mother Solution]

| Yellow Pigment Composition 1: | |
|---|---|
| Polyvinyl butyral ("Eslec B BL-SH", produced by Sekisui Chemical Co., Ltd.) | 7.1 parts |
| Pigment Yellow 180 (C.I. No. 21290) ("Novoperm Yellow P-HG", produced by Clariant Japan) | 12.9 parts |
| Dispersion aid ("SOLSPERSE S-20000", produced by ICI) | 0.6 parts |
| n-Propyl alcohol | 79.4 parts |

[Composition of Yellow Pigment Dispersion Mother Solution]

| Yellow Pigment Composition 2: | |
|---|---|
| Polyvinyl butyral ("Eslec B BL-SH", produced by Sekisui Chemical Co., Ltd.) | 7.1 parts |
| Pigment Yellow 139 (C.I. No. 56298) ("Novoperm Yellow M2R 70", produced by Clariant Japan) | 12.9 parts |
| Dispersion aid ("SOLSPERSE S-20000", produced by ICI) | 0.6 parts |
| n-Propyl alcohol | 79.4 parts |

[Composition of Coating Solution for Yellow Image-Forming Layer]

| | |
|---|---|
| Yellow pigment dispersion mother solution prepared above [Yellow Pigment Composition 1:Yellow Pigment Composition 2 = 95:5 (by parts)] | 126 parts |
| Polyvinyl butyral ("Eslec B BL-SH", produced by Sekisui Chemical Co., Ltd.) | 4.6 parts |
| Wax-base compounds: | |
| (Stearic acid amide, "NEWTRON 2", produced by Nippon Seika) | 0.7 parts |
| (Behenic acid amide, "DIAMID BM", produced by Nippon Kasei) | 0.7 parts |
| (Lauric acid amide, "DIAMID Y", produced by Nippon Kasei) | 0.7 parts |
| (Palmitic acid amide, "DIAMID KP", produced by Nippon Kasei) | 0.7 parts |
| (Erucic acid amide, "DIAMID L-200", produced by Nippon Kasei) | 0.7 parts |
| (Oleic acid amide, "DIAMID O-200", produced by Nippon Kasei) | 0.7 parts |
| Nonionic surfactant ("CHEMISTAT 1100", produced by Sanyo Kasei) | 0.4 parts |
| Rosin ("KE-311", produced by Arakawa Kagaku) (component: 80 to 97% of resin acid, resin acid components: 30 to 40% of abietic acid, 10 to 20% of neoabietic acid, 14% of dihydroabietic acid, 14% of tetrahydroabietic acid) | 2.4 parts |
| Fluorine-containing surfactant (copolymer shown in Table 1) | 0.2 parts |
| n-Propyl alcohol | 793 parts |
| Methyl ethyl ketone | 198 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 2.3 mmHg (=about 0.31 kPa).

The coefficient of static friction on the surface, which is preferably 0.2 or less, was 0.1.

Manufacture of Thermal Transfer Sheet M

Thermal Transfer Sheet M was manufactured in the same manner as in the manufacture of Thermal Transfer Sheet K except for using a coating solution for magenta image-forming layer having a composition shown below in place of the coating solution for black image-forming layer in the manufacture of Thermal Transfer Sheet K. The image-forming layer of Thermal Transfer Sheet M obtained had a layer thickness of 0.38 μm.

[Composition of Magenta Pigment Dispersion Mother Solution]

| Magenta Pigment Composition 1: | |
|---|---|
| Polyvinyl butyral ("DENKA BUTYRAL #2000-L", produced by Electrochemical Industry Co., Ltd., Vicat softening point: 57° C.) | 12.6 parts |
| Pigment Red 57:1 (C.I. No. 15850:1) ("Symuler Brilliant Carmine 6B-229", produced by Dainippon Ink & Chemicals Inc.) | 15.0 parts |
| Dispersion aid ("SOLSPERSE S-20000", produced by ICI) | 0.6 parts |
| n-Propyl alcohol | 80.4 parts |

[Composition of Magenta Pigment Dispersion Mother Solution]

| Magenta Pigment Composition 2: | |
|---|---|
| Polyvinyl butyral ("DENKA BUTYRAL #2000-L", produced by Electrochemical Industry Co., Ltd., Vicat softening point: 57° C.) | 12.6 parts |
| Pigment Red 57:1 (C.I. No. 15850:1) ("Lionol Red 6B-4290G", produced by Toyo Ink Mfg. Co., Ltd.) | 15.0 parts |
| Dispersion aid ("SOLSPERSE S-20000", produced by ICI) | 0.6 parts |
| n-Propyl alcohol | 79.4 parts |

[Composition of Coating Solution for Magenta Image-Forming Layer]

| | |
|---|---|
| Magenta pigment dispersion mother solution prepared above [Magenta Pigment Composition 1:Magenta Pigment Composition 2 = 95:5 (by parts)] | 163 parts |
| Polyvinyl butyral ("DENKA BUTYRAL #2000-L", produced by Electrochemical Industry Co., Ltd., Vicat softening point: 57° C.) | 4.0 parts |
| Wax-base compounds: | |
| (Stearic acid amide, "NEWTRON 2", produced by Nippon Seika) | 1.0 part |
| (Behenic acid amide, "DIAMID BM", produced by Nippon Kasei) | 1.0 part |
| (Lauric acid amide, "DIAMID Y", produced by Nippon Kasei) | 1.0 part |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Nonionic surfactant ("CHEMISTAT 1100", produced by Sanyo Kasei) | 0.7 parts |
| Rosin ("KE-311", produced by Arakawa Kagaku) (component: 80 to 97% of resin acid, resin acid components: 30 to 40% of abietic acid, 10 to 20% of neoabietic acid, 14% of dihydroabietic acid, 14% of tetrahydroabietic acid) | 4.6 parts |

-continued

| | |
|---|---|
| Pentaerythritol tetraacrylate ("NK Ester A-TMMT", produced by Shin Nakamura Kagaku K.K.) | 2.5 parts |
| Fluorine-containing surfactant (copolymer shown in Table 1) | 0.3 parts |
| n-Propyl alcohol | 848 parts |
| Methyl ethyl ketone | 246 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RE, was 3.5 mmHg (=about 0.47 kPa).

The coefficient of static friction on the surface, which is preferably 0.2 or less, was 0.08.

Manufacture of Thermal Transfer Sheet C

Thermal Transfer Sheet C was manufactured in the same manner as in the manufacture of Thermal Transfer Sheet K except for using a coating solution for cyan image-forming layer having a composition shown below in place of the coating solution for black image-forming layer in the manufacture of Thermal Transfer Sheet K. The image-forming layer of Thermal Transfer Sheet C obtained had a layer thickness of 0.45 μm.

[Composition of Cyan Pigment Dispersion Mother Solution]

| Cyan Pigment Composition 1: | |
|---|---|
| Polyvinyl butyral ("Eslec B BL-SH", produced by Sekisui Chemical Co., Ltd.) | 12.6 parts |
| Pigment Blue 15:4 (C.I. No. 74160) ("Cyanine Blue 700-10FG", produced by Toyo Ink Mfg. Co., Ltd.) | 15.0 parts |
| Dispersion aid ("PW-36", produced by Kusumoto Kasei K.K.) | 0.8 parts |
| n-Propyl alcohol | 110 parts |

[Composition of Cyan Pigment Dispersion Mother Solution]

| Cyan Pigment Composition 2: | |
|---|---|
| Polyvinyl butyral ("Eslec B BL-SH", produced by Sekisui Chemical Co., Ltd.) | 12.6 parts |
| Pigment Blue 15 (C.I. No. 74160) ("Lionol Blue 7027", produced by Toyo Ink Mfg. Co., Ltd.) | 15.0 parts |
| Dispersion aid ("PW-36", produced by Kusumoto Kasei K.K.) | 0.8 parts |
| n-Propyl alcohol | 110 parts |

[Composition of Coating Solution for Cyan Image-Forming Layer]

| | |
|---|---|
| Cyan pigment dispersion mother solution prepared above [Cyan Pigment Composition 1:Cyan Pigment Composition 2 = 90:10 (by parts)] | 118 parts |
| Polyvinyl butyral ("Eslec B BL-SH", produced by Sekisui Chemical Co., Ltd.) | 5.2 parts |
| Inorganic pigment "MEK-ST" | 1.3 parts |

-continued

| Wax-base compounds: | |
|---|---|
| (Stearic acid amide, "NEWTRON 2", produced by Nippon Seika) | 1.0 part |
| (Behenic acid amide, "DIAMID BM", produced by Nippon Kasei) | 1.0 part |
| (Lauric acid amide, "DIAMID Y", produced by Nippon Kasei) | 1.0 part |
| (Palmitic acid amide, "DIAMID KP", produced by Nippon Kasei) | 1.0 part |
| (Erucic acid amide, "DIAMID L-200", produced by Nippon Kasei) | 1.0 part |
| (Oleic acid amide, "DIAMID O-200", produced by Nippon Kasei) | 1.0 part |
| Rosin ("KE-311", produced by Arakawa Kagaku) (component: 80 to 97% of resin acid, resin acid components: 30 to 40% of abietic acid, 10 to 20% of neoabietic acid, 14% of dihydroabietic acid, 14% of tetrahydroabietic acid) | 2.8 parts |
| Pentaerythritol tetraacrylate ("NK Ester A-TMMT", produced by Shin Nakamura Kagaku K.K.) | 1.7 parts |
| Fluorine-containing surfactant (copolymer shown in Table 1) | 0.4 parts |
| n-Propyl alcohol | 890 parts |
| Methyl ethyl ketone | 247 parts |

The obtained image-forming layer had the following physical properties.

The surface hardness of the image-forming layer, which is preferably 10 g or more with a sapphire needle, was 200 g or more.

The Smooster value on the surface, which is preferably from 0.5 to 50 mmHg (=about 0.0665 to 6.65 kPa) at 23° C. and 55% RH, was 7.0 mmHg (=about 0. 93 kPa)

The coefficient of static friction on the surface, which is preferably 0.2 or less, was 0.08.

The thus-manufactured thermal transfer sheets each was evaluated on the uniformity of surface state and the uniform transferability by the following methods. The results obtained are shown in Table 1.

Evaluation Method of Uniformity of Surface State of Image-Forming Layer:

The thermal transfer sheet was observed with an eye over Schaukasten and evaluated on repellency and unevenness. The rating was ○ when repellency and unevenness were not observed with an eye, Δ when slightly observed, and X when rather clearly observed.

Evaluation of Uniform Transferability:

An image was transferred using the following image-receiving sheet by the following transferring method and the image transferred on the image-receiving sheet was evaluated with an eye.

○: No missing and no unevenness.

X: Missing and unevenness were observed.

Manufacture of Image-Receiving Sheet

A coating solution for cushion layer and a coating solution for image-receiving layer each having the following composition were prepared.

| 1) Coating Solution for Cushion Layer | |
|---|---|
| Vinyl chloride-vinyl acetate copolymer (main binder) ("MPR-TSL", produced by Nisshin Kagaku) | 20 parts |
| Plasticizer ("PARAPLEX G-40", produced by CP. HALL. COMPANY) | 10 parts |

-continued

| | |
|---|---|
| Surfactant (fluorine-containing, coating aid) ("Megafac F-177", produced by Dainippon Ink & Chemicals Inc.) | 0.5 parts |
| Antistatic agent (quaternary ammonium salt) ("SAT-5 Supper (IC)", produced by Nippon Junyaku K.K.) | 0.3 parts |
| Methyl ethyl ketone | 60 parts |
| Toluene | 10 parts |
| N,N-Dimethylformamide | 3 parts |
| 2) Coating Solution for Image-Receiving Layer | |
| Polyvinyl butyral (binder) ("Eslec BBL-1", produced by Sekisui Chemical Co., Ltd.) | 8 parts |
| Antistatic agent ("SANSTAT 2012A", produced by Sanyo Kasei) | 0.7 parts |
| Surfactant ("Megafac F-176PF", produced by Dainippon Ink & Chemicals Inc.) | 0.1 part |
| n-Propyl alcohol | 20 parts |
| Methanol | 20 parts |
| 1-Methoxy-2-propanol | 50 parts |

The coating solution for the formation of cushion layer prepared above was coated on a white PET support ("LUMIRROR #130E58", produced by Toray Industries, Inc., thickness: 130 μm) using a small-width coating machine and then, the coated layer was dried. Thereafter, the coating solution for image-receiving layer was coated and dried. The coated amounts of coating solutions were controlled such that after the drying, the cushion layer had a thickness of about 20 μm and the image-receiving layer had a thickness of about 2 μm. The white PET support was a void-containing plastic support comprising a laminate (total thickness: 130 μm, specific gravity: 0.8) of a void-containing polyethylene terephthalate layer (thickness: 116 μm, porosity: 20%) and titanium oxide-containing polyethylene terephthalate layers (thickness: 7 μm, titanium oxide content: 2%) provided on both surfaces of the void-containing polyethylene terephthalate layer. The manufactured image-receiving sheet was taken up into a roll form and stored at room temperature for 1 week. Thereafter, this image-receiving sheet was used for image recording by laser light described below.

Formation of Transfer Image

The image-receiving sheet (56 cm×79 cm) prepared above was wound around a 35 cm-diameter rotary drum having punched thereon vacuum section holes (plane density: 1 hole per area of 3 cm×8 cm) having a diameter of 1 mm, and vacuum-adsorbed. Subsequently, Thermal Transfer Sheet K (black) prepared above, which was cut into 61 cm×84 cm, was superposed to uniformly protrude from the image-receiving sheet, and contact-laminated while suctioning air through the section holes by squeezing with a squeeze roller. The pressure reduction degree was −150 mmHg (=about 81.13 kPa) based on 1 atm. in the state where the section holes were closed. The drum was rotated and on the surface of laminate adsorbed on the drum, semiconductor laser light at a wavelength of 808 nm was irradiated from the outside and converged to form a spot of 7 μm on the surface of the light-to-heat conversion layer. While moving the light in the direction (sub-scanning) right-angled to the rotating direction (main scanning direction) of the rotary drum, a laser image (image line) was recorded on the laminate. The laser irradiation conditions were as follows. The laser beam used in this Example was a laser beam having a multi-beam two-dimensional arrangement comprising parallelograms forming 5 lines in the main scanning direction and 3 lines in the sub-scanning direction.

| | |
|---|---|
| Laser power: | 110 mW |
| Rotation number of drum | 500 rpm |
| Sub-scanning pitch | 6.35 μm |

Humidity and temperature in environment:

three conditions of 18° C. and 30%, 23° C. and 50% and 26° C. and 65%

The diameter of exposure drum, which is preferably 360 mm or more, was 380 mm.

The image size was 515 mm×728 mm and the resolution was 2,600 dpi.

After the completion of laser recording, the laminate was removed from the drum and Thermal Transfer Sheet K was manually peeled off from the image-receiving sheet, as a result, it was confirmed that in all cases, only the image-forming layer of Thermal Transfer Sheet K in the region irradiated with light was transferred to the image-receiving sheet from Thermal Transfer Sheet K.

In the same manner as above, an image was transferred to the image-receiving sheet from each thermal transfer sheet of Thermal Transfer Sheet Y, Thermal Transfer Sheet M and Thermal Transfer Sheet C. The four-color image thus transferred was further transferred to recording paper to form a multicolor image. As a result, it was confirmed that the image-forming layer of the thermal transfer sheet only in the region irradiated with light was transferred to the image-receiving sheet from the thermal transfer sheet even when laser recording with high energy was performed using laser light having a multi-beam two-dimensional arrangement.

The transfer to printing paper was performed using a thermal transfer apparatus where the coefficient of dynamic friction against polyethylene terephthalate as an insertion bed material is from 0.1 to 0.7 and the transportation speed is from 15 to 50 mm/sec. The Vickers hardness of the heat roll material of the thermal transfer appar a tus is preferably from 10 to 100 and the Vickers hardness of the apparatus used here was 70.

In all of Examples 1 to 3, the obtained image exhibited good results for three kinds of environmental temperature and humidity conditions.

Examples 4 to 6

Examples 4 to 6 were performed in the same manner as Examples 1 to 3 except that in Examples 1 to 3, the fluorine-containing surfactant (copolymer (I)) was not used in the coating solution for image-forming layer of the thermal transfer sheet and a fluorine-containing surfactant (copolymer (I)) shown in Table 1 was used in place of the surfactant used in the coating solution for image-receiving layer of the image-receiving sheet. The results on the uniformity of the coated surface state of the image-receiving layer and the transferabilityare shown in Table 1.

In Examples 4 to 6, the image transferred to printing paper exhibited good results for all of three kinds of environmental temperature and humidity conditions.

TABLE 1

| | Copolymer (I) | | | | | | | Uniformity of Coated | |
|---|---|---|---|---|---|---|---|---|---|
| | (A) | | (B) | | (C) | | | Surface | Transfer- |
| | x | n | y | s | z | t | Mw | State | ability |
| Example | | | | | | | | | |
| 1, 4 | 40 | 6 | 35 | 7 | 25 | 7 | 33000 | ○ | ○ |
| 2, 5 | 40 | 6 | 55 | 7 | 5 | 7 | 34000 | ○ | ○ |
| 3, 6 | 40 | 4 | 55 | 7 | 5 | 7 | 31000 | ○ | ○ |
| Comparative Example 1 | | | | none | | | | X | X |

Mw: Mass average molecular weight

In Table 1, the uniformity of the coated surface state was that of the image-forming layer in Examples 1 to 3, that of the image-receiving layer in Examples 4 to 6, and that of both layers in Comparative Example 1.

It is apparent from the results shown in Table 1 that the image-forming layer or image-receiving layer containing the fluorine-containing surfactant (copolymer (I)) has a uniform surface state and exhibits excellent transfer-ability of an image formed on the image-forming layer to the image-receiving layer.

In the multicolor image forming material comprising a thermal transfer sheet and an image-receiving sheet of the present invention, at least either one of the image-forming layer and the image-receiving layer has a uniform coated surface state and the transferability of an image formed on the image-forming layer to the image-receiving layer is excellent.

By the multicolor image forming method using the multicolor image forming material having excellent performance of the present invention, for example, a contract proof capable of coping with the filmless system in the CTP time and substituting proof printing or analogue-type color proof can be provided and this proof can realize color reproduction agreeing with the printed matter for obtaining approval of customers or with the analogue-type color proof.

This application is based on Japanese Patent application JP 2002-166115, filed Jun. 6, 2002, the entire content of which is hereby incorporated by reference, the same as if set forth at length.

What is claimed is:

1. A multicolor image forming material comprising:

an image-receiving sheet comprising an image-receiving layer; and at least four thermal transfer sheets differing in color each comprising a support, a light-to-heat conversion layer and an image-forming layer, wherein the image forming material is used for recording a multicolor image by superposing the image-forming layer of each thermal transfer sheet and the image-receiving layer to face each other, irradiating laser light and transferring a region irradiated with the laser light of the image-forming layer onto the image-receiving layer, and at least one layer selected from the image-receiving layer and the image-forming layers comprises, as a fluorine-containing surfactant, a copolymer (I) comprising following repeating units (A), (B) and (C):

(A):

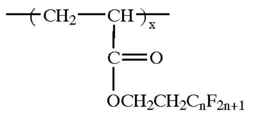

(B):

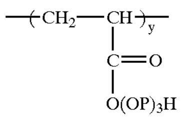

(C):

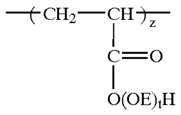

wherein n represents an integer of 1 to 10, x, y and z represent molar fractions (%) of the repeating units (A), (B) and (C), respectively, and x is from 10 to 80%, y is from 5 to 85% and z is from 5 to 85%, provided that x+y+z=100 mol %, s represents an integer of 2 to 18, t represents an integer of 2 to 18, PO represents $—CH_2CHCH_3O—$, and EO represents $—CH_2CH_2O—$.

2. The multicolor image forming material according to claim 1, wherein a resolution of the image transferred onto the image-receiving layer is 2,000 dpi or more.

3. The multicolor image forming material according to claim 1, wherein a ratio of an optical density to a film thickness of the light-to-heat conversion layer of each thermal transfer sheet is 0.57 or more.

4. The multicolor image forming material according to claim 1, wherein a ratio of an optical density to a film thickness of the light-to-heat conversion layer of each thermal transfer sheet is 1 or more.

5. The multicolor image forming material according to claim 1, wherein a ratio of an optical density to a film thickness of the light-to-heat conversion layer of each thermal transfer sheet is 1.50 or more.

6. The multicolor image forming material according to claim 1, wherein a ratio of an optical density (OD) to a film thickness of the image-forming layer of each thermal transfer sheet is 1.80 or more.

7. The multicolor image forming material according to claim 1, wherein a ratio of an optical density (OD) to a film thickness of the image-forming layer of each thermal transfer sheet is 2.50 or more.

8. The multicolor image forming material according to claim 1, wherein colors of the at least four thermal transfer sheets comprises black, cyan, magenta and yellow.

* * * * *